US012795965B2

(12) United States Patent
Soneda et al.

(10) Patent No.: US 12,795,965 B2
(45) Date of Patent: Nov. 10, 2026

(54) RC-IGBT

(71) Applicant: Mitsubishi Electric Corporation, Tokyo (JP)

(72) Inventors: Shinya Soneda, Tokyo (JP); Koichi Nishi, Tokyo (JP); Kazuya Konishi, Tokyo (JP); Kohei Ebihara, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 325 days.

(21) Appl. No.: 18/443,253

(22) Filed: Feb. 15, 2024

(65) Prior Publication Data

US 2024/0313095 A1 Sep. 19, 2024

(30) Foreign Application Priority Data

Mar. 14, 2023 (JP) ................................ 2023-039756
Dec. 21, 2023 (JP) ................................ 2023-215473

(51) Int. Cl.
*H10D 12/00* (2025.01)
*H10D 84/00* (2025.01)

(52) U.S. Cl.
CPC ......... *H10D 12/481* (2025.01); *H10D 12/415* (2025.01); *H10D 84/161* (2025.01)

(58) Field of Classification Search
CPC ... H10D 12/481; H10D 12/415; H10D 84/161
See application file for complete search history.

(56) References Cited

U.S. PATENT DOCUMENTS

| | | | |
|---|---|---|---|
| 2010/0156506 | A1 | 6/2010 | Tsuzuki et al. |
| 2019/0319026 | A1 | 10/2019 | Yoshida |
| 2020/0168727 | A1 | 5/2020 | Beninger-Bina et al. |
| 2021/0288156 | A1 | 9/2021 | Fukui et al. |

(Continued)

FOREIGN PATENT DOCUMENTS

| | | | |
|---|---|---|---|
| DE | 10 2018 130 095 | A1 | 5/2020 |
| JP | 2010-171385 | A | 8/2010 |
| JP | 2019-186504 | A | 10/2019 |

(Continued)

OTHER PUBLICATIONS

Antoniou et al.; "Deep p-Ring Trench Termination: An Innovative and Cost-Effective Way to Reduce Silicon Area"; IEEE Electron Device Letters; Jan. 3, 2019; pp. 177-180; vol. 40, No. 2; IEEE; URL: https://ieeexplore.ieee.org/document/8600343.

(Continued)

*Primary Examiner* — Peter M Albrecht
(74) *Attorney, Agent, or Firm* — Studebaker Brackett PLLC

(57) ABSTRACT

An RC-IGBT includes a semiconductor substrate having a cell region, a wiring region, and a termination region. The semiconductor substrate includes a diffusion layer of a second conductivity type provided on a first main surface side of a drift layer in an IGBT region, a diode region, the wiring region, and the termination region. The diffusion layer includes a base layer in the IGBT region, an anode layer in the diode region, a wiring well layer in the wiring region, and a termination well layer in the termination region. A depth of the base layer is less than depths of a plurality of trench gates, and is equal to or more than depths of the anode layer, the wiring well layer, and the termination well layer.

12 Claims, 20 Drawing Sheets

(56) References Cited

U.S. PATENT DOCUMENTS

| | | | |
|---|---|---|---|
| 2023/0124922 A1 | 4/2023 | Ozaki et al. | |

FOREIGN PATENT DOCUMENTS

| | | | |
|---|---|---|---|
| JP | 2021-128993 | A | 9/2021 |
| WO | 2018/225600 | A1 | 12/2018 |
| WO | 2022/158053 | A1 | 7/2022 |

OTHER PUBLICATIONS

Office Action issued in DE 10 2024 106 423.4; mailed by the German Patent and Trademark Office on Jun. 22, 2026.

"Notice of Reasons for Refusal" Office Action issued in JP 2023-215473; mailed by the Japanese Patent Office on Aug. 25, 2026.

C-C SECTION

D-D SECTION

G-G SECTION

E-E SECTION

F-F SECTION

RC-IGBT

BACKGROUND OF THE INVENTION

Field of the Invention

The present disclosure relates to a reverse conducting IGBT (RC-IGBT).

Description of the Background Art

An RC-IGBT is a semiconductor device in which an insulated gate bipolar transistor (IGBT) region and a diode region are provided on one semiconductor substrate. Japanese Patent Application Laid-Open No. 2019-186504 discloses an RC-IGBT that has an IGBT region, a diode region, a wiring region, and a termination region, and the termination region has a p-type well layer that is deeper than a p-type base layer and a trench in the IGBT region so as to act to relax an electric field when holding a reverse withstand voltage.

In the RC-IGBT of Japanese Patent Application Laid-Open No. 2019-186504, the p-type well layer in the termination region is deeper than the p-type base layer in the IGBT region. Therefore, a manufacturing step of forming a plurality of p-type diffusion layers having different depths one by one is required, and there is a problem that manufacturing cost increases.

SUMMARY

An object of the present disclosure is to reduce manufacturing cost of an RC-IGBT.

The RC-IGBT of the present disclosure includes a semiconductor substrate. The semiconductor substrate has a cell region, a termination region, and a wiring region. The cell region includes an IGBT region and a diode region. The wiring region is provided between the cell region and the termination region. The semiconductor substrate has a first main surface and a second main surface that is a main surface on the opposite side of the first main surface. The semiconductor substrate includes a drift layer of a first conductivity type and a diffusion layer of a second conductivity type. The drift layer is provided in the cell region, the wiring region, and the termination region. The diffusion layer is provided on the first main surface side of the drift layer in the IGBT region, the diode region, the wiring region, and the termination region. The diffusion layer includes a base layer in the IGBT region, an anode layer in the diode region, a wiring well layer in the wiring region, and a termination well layer in the termination region. A plurality of trench gates are formed in the semiconductor substrate. The plurality of trench gates penetrate the diffusion layer from the first main surface to reach the drift layer. The plurality of trench gates include a plurality of active trench gates in the IGBT region, a plurality of diode trench gates in the diode region, and a plurality of wiring trench gates in the wiring region. A depth of the base layer is less than depths of the plurality of active trench gates, and is equal to or more than depths of the anode layer, the wiring well layer, and the termination well layer.

According to the RC-IGBT of the present disclosure, the diffusion layer of the second conductivity type can be simultaneously formed in the IGBT region, the diode region, the wiring region, and the termination region, and thus, the manufacturing cost can be reduced.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

In the following description, n and p represent conductivity types of a semiconductor. Although description is given assuming that a first conductivity type is an n type and a second conductivity type is a p type in the present disclosure, the first conductivity type may be the p type, and the second conductivity type may be the n type. In addition, n-indicates an n-type impurity concentration lower than n, and n+ indicates an n-type impurity concentration higher than n. Similarly, p− indicates a p-type impurity concentration lower than p, and p+ indicates a p-type impurity concentration higher than p.

<A. Basic Technology>

Figure 1:
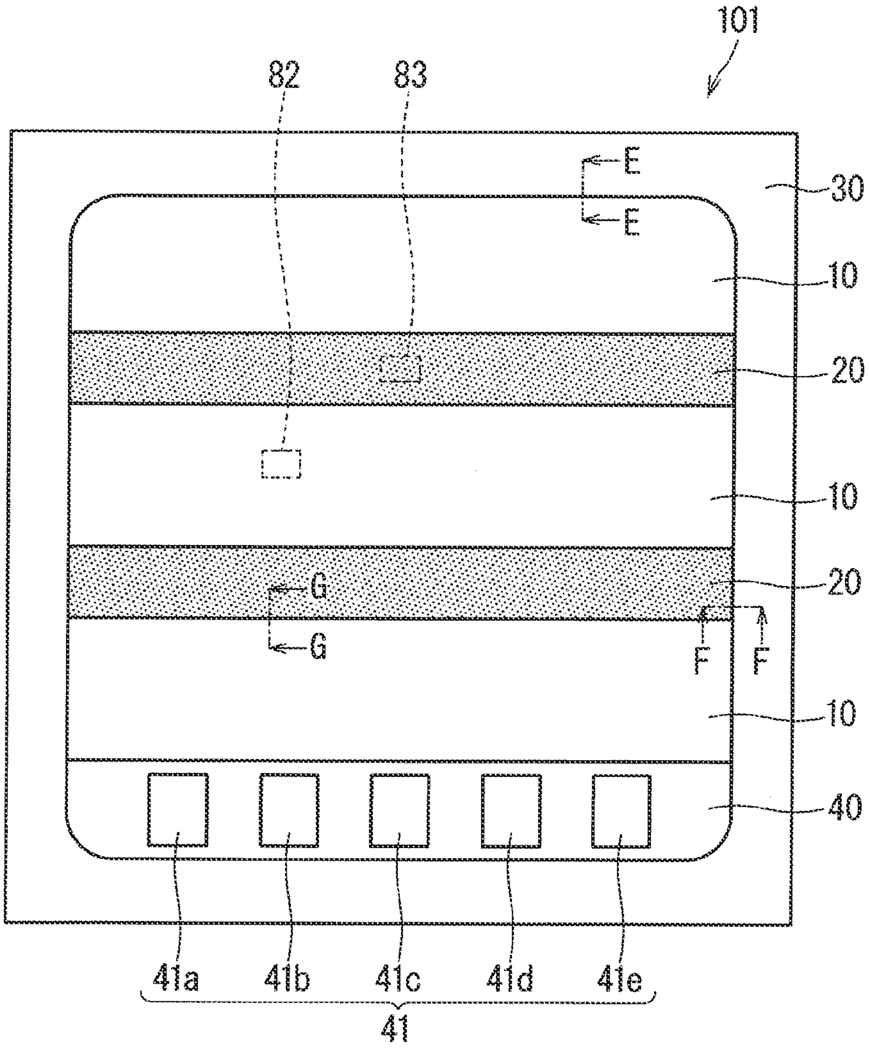
FIG. 1 is a plan view of a stripe-type RC-IGBT.
Figure 2:
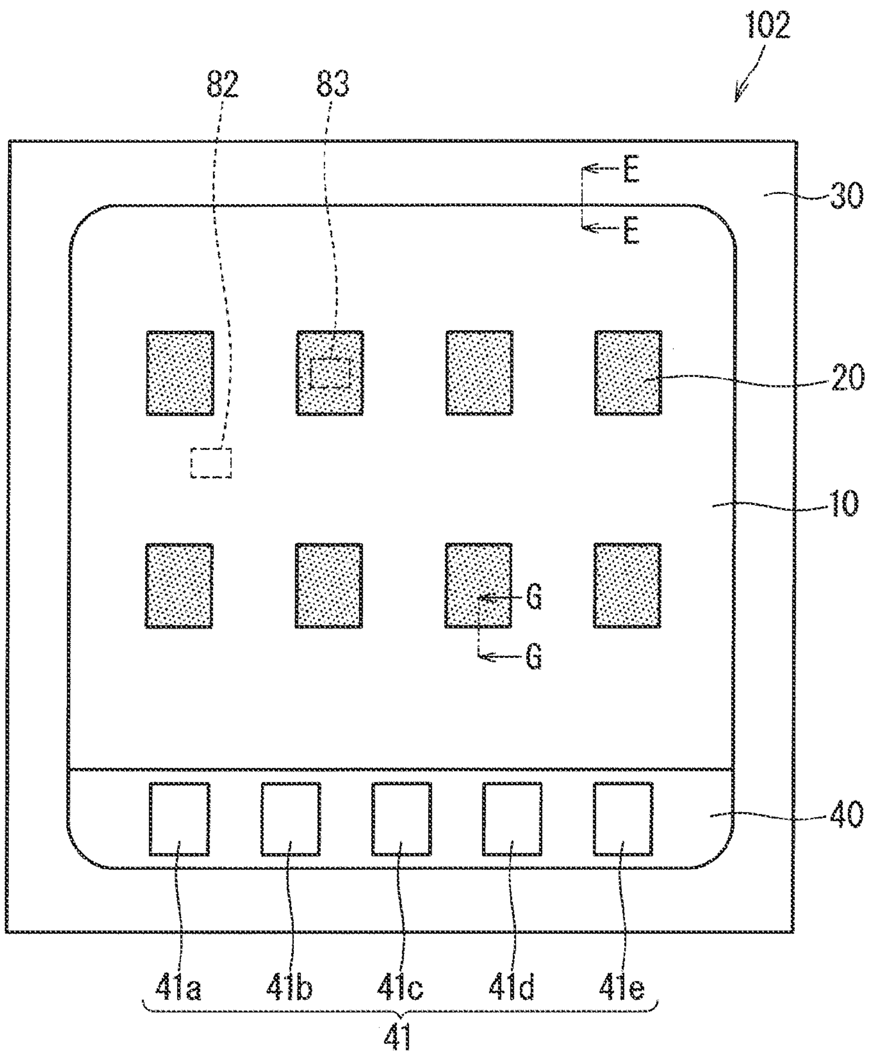
FIG. 2 is a plan view of an island-type RC-IGBT.

FIG. 1 is a plan view illustrating an RC-IGBT 101 which is a semiconductor device according to the basic technology. FIG. 2 is a plan view illustrating an RC-IGBT 102 that is a semiconductor device having another configuration according to the basic technology. The RC-IGBT 101 illustrated in FIG. 1 includes an IGBT region 10 and a diode region 20 provided side by side in a stripe shape, and is also simply referred to as a "stripe type". The RC-IGBT 102 illustrated in FIG. 2 includes a plurality of diode regions 20, provided in the vertical direction and the horizontal direction, and an IGBT region 10 provided around the diode regions 20, and is also simply referred to as an "island type".

(1) Stripe Type

As illustrated in FIG. 1, the RC-IGBT 101 includes the IGBT region 10 and the diode region 20. The IGBT region 10 and the diode region 20 extend from one end side to the other end side of the RC-IGBT 101. The IGBT region 10 and the diode region 20 are alternately provided in a direction orthogonal to each extending direction, that is, in a stripe shape. In FIG. 1, the RC-IGBT 101 includes three IGBT regions 10 and two diode regions 20. Each of the diode regions 20 is sandwiched between the IGBT regions 10. However, the number of the IGBT regions 10 and the number of the diode regions 20 in the RC-IGBT 101 are not limited to those in an example of FIG. 1. The number of the IGBT regions 10 may be more or less than three, and the number of the diode regions 20 may be more or less than two. In addition, arrangements of the IGBT regions 10 and the diode regions 20 may be interchanged. In this case, each of the IGBT regions 10 is sandwiched between the diode regions 20. In addition, one IGBT region 10 and one diode region 20 may be provided adjacent to each other.

As illustrated in FIG. 1, a pad region 40 is provided adjacent to the IGBT region 10 on the lower side on the paper surface. A plurality of control pads 41 configured to control the RC-IGBT 101 are provided in the pad region 40. The IGBT region 10 and the diode region 20 are collectively referred to as a cell region. A termination region 30 is provided around a combined region of the cell region and the pad region 40 in order to hold a withstand voltage of the RC-IGBT 101. A known withstand voltage holding structure is appropriately selected and provided in a termination region 30. As the withstand voltage holding structure, a field limiting ring (FLR) in which the cell region is surrounded by a p-type termination well layer of a p-type semiconductor may be provided on a front surface side of the RC-IGBT 101. Alternatively, as the withstand voltage holding structure, variation of lateral doping (VLD) in which the cell region is surrounded by a p-type well layer with a concentration gradient may be provided on the front surface side of the RC-IGBT 101. The number of ring-shaped p-type termination well layers used for the FLR or concentration distribution used for the VLD may be appropriately selected according to withstand voltage design of the RC-IGBT 101. In addition, the p-type termination well layer may be provided over substantially the entire pad region 40. In addition, an IGBT cell or a diode cell may be provided in the pad region 40.

The control pad 41 includes, for example, a current sense pad 41*a*, a Kelvin emitter pad 41*b*, a gate pad 41*c*, and temperature sense diode pads 41*d* and 41*e*. The current sense pad 41*a* is a control pad configured to sense a current flowing through the cell region of the RC-IGBT 101, and is a control pad electrically connected to a part of the IGBT cell or the diode cell in the cell region such that a current of a fraction to a fraction of tens of thousandths of a current flowing through the entire cell region flows when the current flows through the cell region of the RC-IGBT 101. The Kelvin emitter pad 41*b* and the gate pad 41*c* are control pads to which a gate drive voltage for controlling on and off of the RC-IGBT 101 is applied. The Kelvin emitter pad 41*b* is electrically connected to a p-type base layer of the IGBT cell, and the gate pad 41*c* is electrically connected to a gate trench electrode of the IGBT cell. The Kelvin emitter pad 41*b* and the p-type base layer may be electrically connected via a p+ type contact layer. The temperature sense diode pads 41*d* and 41*e* are control pads electrically connected to an anode and a cathode of a temperature sense diode provided in the RC-IGBT 101. A voltage between the anode and the cathode of the temperature sense diode (not illustrated) provided in the cell region is measured to measure the temperature of the RC-IGBT 101.

(2) Island Type

In FIG. 2, the RC-IGBT 102 includes the IGBT region 10 and the plurality of diode regions 20. The plurality of diode regions 20 are arrayed in the vertical direction and the horizontal direction, and are surrounded by the IGBT region 10. That is, the plurality of diode regions 20 are provided in an island shape in the IGBT region 10. Although the diode regions 20 are provided in a matrix of four columns in the left-right direction (horizontal direction) on the paper surface and two rows in the up-down direction (vertical direction) on the paper surface in FIG. 2, the number and arrangement of the diode regions 20 are not limited thereto. It is sufficient to adopt a configuration in which one diode region 20 or a plurality of diode regions 20 are interspersed in the IGBT region 10, and each of the diode regions 20 is surrounded by the IGBT region 10.

As illustrated in FIG. 2, the pad region 40 is provided adjacent to the lower side of the IGBT region 10 on the paper surface. Configurations of the pad region 40 and the termination region 30 in the RC-IGBT 102 are similar to those in the RC-IGBT 101.

(3) IGBT Region

Figure 3:
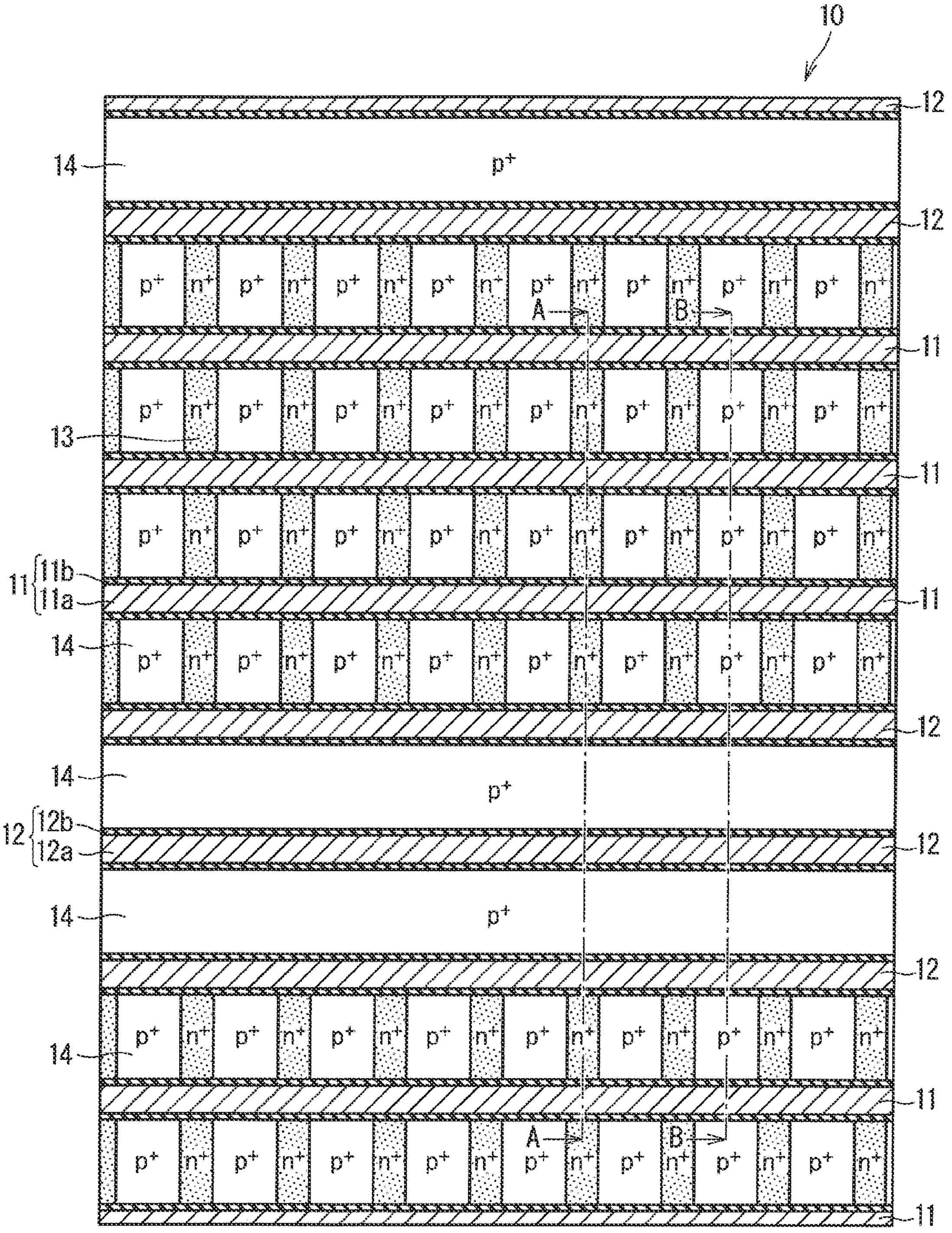
FIG. 3 is a plan view of an IGBT region of an RC-IGBT.
Figure 4:
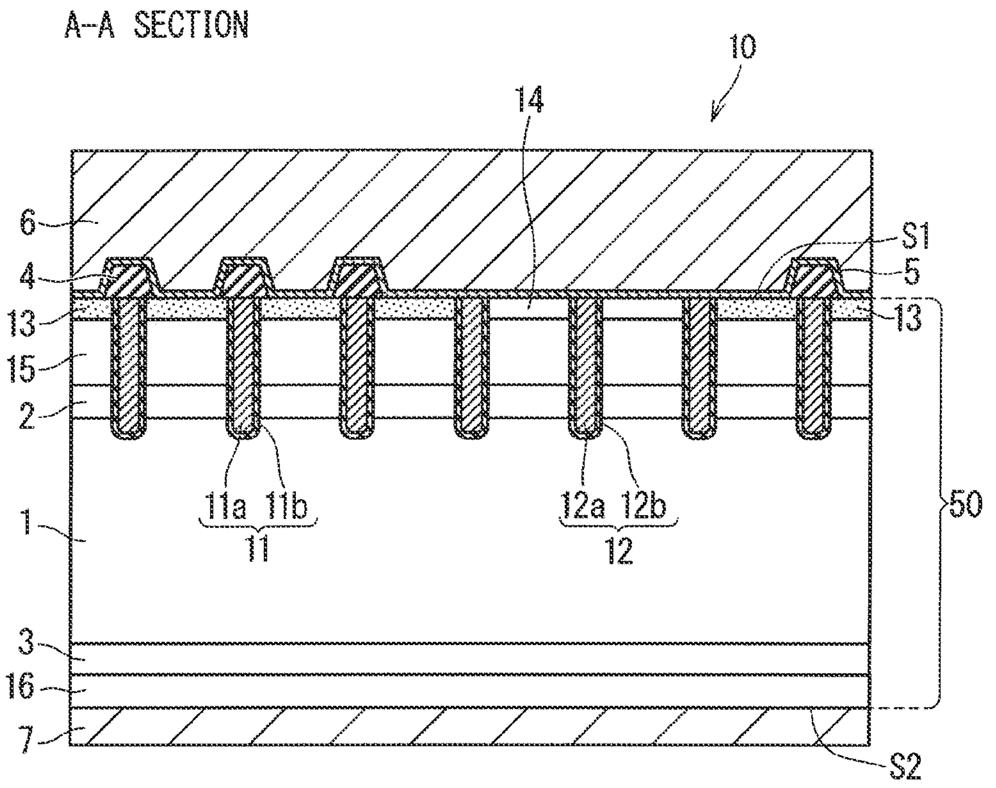
FIG. 4 is a cross-sectional view of the IGBT region of the RC-IGBT taken along line A-A in FIG. 3.
Figure 5:
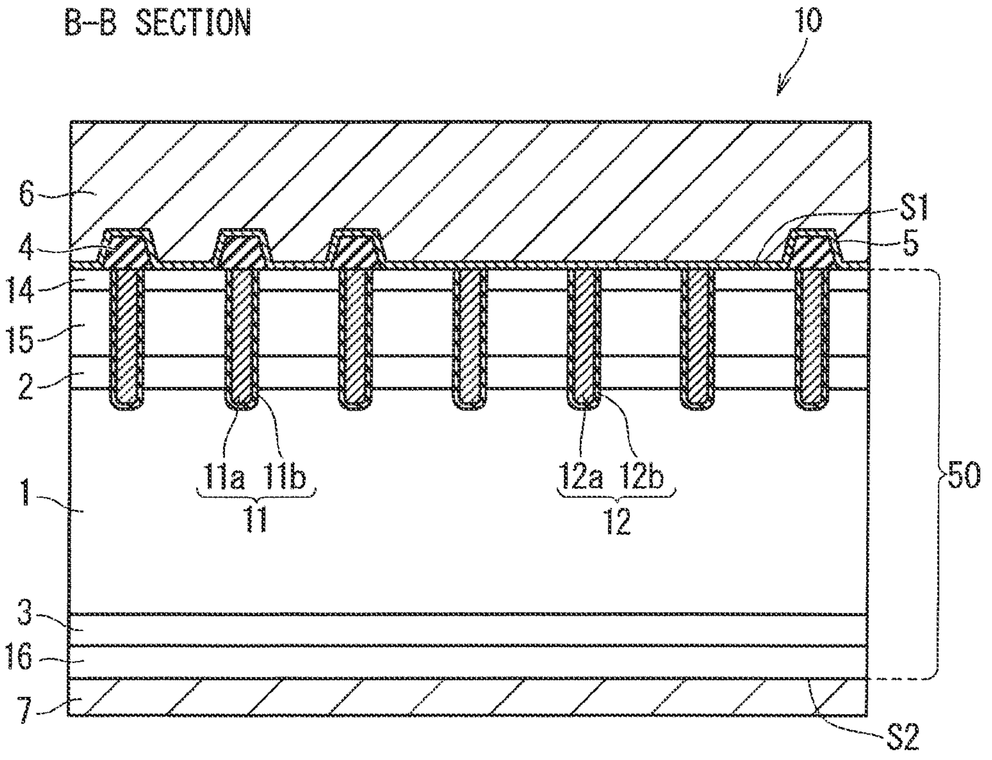
FIG. 5 is a cross-sectional view of the IGBT region of the RC-IGBT taken along line B-B in FIG. 3.

FIG. 3 is a partially enlarged plan view illustrating a region surrounded by a broken line 82 in FIG. 1 or 2 in the IGBT region 10 of the RC-IGBT 101 or 102. FIG. 4 is a cross-sectional view of the IGBT region 10 taken along line A-A in FIG. 3. FIG. 5 is a cross-sectional view of the IGBT region 10 taken along line B-B in FIG. 3.

As illustrated in FIG. 3, the IGBT region 10 includes an active trench gate 11 and a dummy trench gate 12 provided in a stripe shape. In the RC-IGBT 101, the active trench gate 11 and the dummy trench gate 12 extend in the longitudinal direction of the IGBT region 10. That is, a longitudinal direction of the IGBT region 10 is a longitudinal direction of each of the active trench gate 11 and the dummy trench gate 12. Meanwhile, in the RC-IGBT 102, there is no particular distinction between the longitudinal direction and a lateral direction in the IGBT region 10. The left-right direction on the paper surface of FIG. 2 may be the longitudinal direction of each of the active trench gate 11 and the dummy trench gate 12, and the up-down direction on the paper surface of FIG. 2 may be the longitudinal direction of each of the active trench gate 11 and the dummy trench gate 12.

The active trench gate 11 has a configuration in which a gate trench electrode 11*a* is provided in a trench formed in a semiconductor substrate 50 with a gate trench insulating film 11*b* interposed therebetween. The dummy trench gate 12 has a configuration in which a dummy trench electrode 12*a* is provided in a trench formed in the semiconductor substrate 50 with a dummy trench insulating film 12*b* interposed therebetween. The gate trench electrode 11*a* of the active trench gate 11 is electrically connected to the gate pad 41*c*. The dummy trench electrode 12*a* of the dummy trench gate 12 is electrically connected to an emitter electrode 6 on the front surface side of the RC-IGBT 101 or 102.

A n+ type source layer 13 is provided on both sides in a width direction of the active trench gate 11 so as to be in contact with the gate trench insulating film 11*b*. The n+ type source layer 13 is a semiconductor layer containing, for example, arsenic or phosphorus as n-type impurities, and a concentration of the n-type impurities is $1.0\times10^{17}/cm^3$ or more and $1.0\times10^{20}/cm^3$ or less. The n+ type source layer 13 is provided alternately with a p+ type contact layer 14 along an extending direction of the active trench gate 11. Note that the n+ type source layer is also referred to as an n+ type emitter layer. The p+ type contact layer 14 is also provided between two adjacent dummy trench gates 12. The p+ type contact layer 14 is a semiconductor layer containing, for example, boron or aluminum as p-type impurities, and a concentration of the p-type impurities is $1.0\times10^{15}/cm^3$ or more and $1.0\times10^{20}/cm^3$ or less.

In FIG. 3, three of the active trench gates 11 and three of the dummy trench gates 12 are alternately arranged. In other words, a set of active trench gates 11 including three active trench gates 11 and a set of dummy trench gates 12 including three dummy trench gates 12 are alternately arranged. However, the number of active trench gates 11 constituting a set of active trench gates 11 is not limited to three, and may be one or more. In addition, the number of dummy trench gates 12 constituting a set of dummy trench gates 12 is not limited to three, and any number of one or more can be used. Furthermore, the dummy trench gate 12 is not necessarily provided in the IGBT region 10. That is, the entire trench provided in the IGBT region 10 may be the active trench gate 11.

As illustrated in FIG. 4, the RC-IGBT 101 or 102 includes an n-type drift layer 1 formed of the semiconductor substrate 50 in the IGBT region 10. The n-type drift layer 1 is a semiconductor layer containing, for example, arsenic or phosphorus as n-type impurities, and a concentration of the n-type impurities is $1.0\times10^{12}/cm^3$ or more and $1.0\times10^{15}/cm^3$ or less. In FIG. 4, a range from the n+ type source layer 13 and the p+ type contact layer 14 to a p-type collector layer 16 corresponds to the semiconductor substrate 50. Upper ends of the n+ type source layer 13 and the p+ type contact layer 14 on the paper surface of FIG. 4 correspond to a first main surface S1 of the semiconductor substrate 50, and a lower end of the p-type collector layer 16 on the paper surface corresponds to a second main surface S2 of the semiconductor substrate 50. The first main surface S1 of the semiconductor substrate 50 is a main surface on the front surface side of the RC-IGBT 101 or 102, and the second main surface S2 of the semiconductor substrate 50 is a main surface on a back surface side of the RC-IGBT 101 or 102. The RC-IGBT 101 or 102 has the n-type drift layer 1 between the first main surface S1 and the second main surface S2 opposite to the first main surface S1 in the IGBT region 10 which is the cell region.

On the first main surface S1 side of the n-type drift layer 1 in the IGBT region 10, an n-type carrier accumulation layer 2 having a higher n-type impurity concentration than the n-type drift layer 1 is provided. The n-type carrier accumulation layer 2 is a semiconductor layer containing, for example, arsenic or phosphorus as n-type impurities, and the concentration of the n-type impurities is $1.0\times10^{13}/cm^3$ or more and $1.0\times10^{17}/cm^3$ or less. Note that the RC-IGBT 101 or 102 does not necessarily include the n-type carrier accumulation layer 2. In this case, the n-type drift layer 1 is also provided in a region of the n-type carrier accumulation layer 2 illustrated in FIG. 4.

Since the RC-IGBT 101 or 102 includes the n-type carrier accumulation layer 2, conduction loss when a current flows through the IGBT region 10 can be reduced. The n-type carrier accumulation layer 2 and the n-type drift layer 1 may be collectively referred to as a drift layer. The n-type carrier accumulation layer 2 is formed by ion-implanting the n-type impurities into the semiconductor substrate 50 forming the n-type drift layer 1, and then diffusing the implanted n-type impurities into the semiconductor substrate 50, which is the n-type drift layer 1, by annealing.

A p-type base layer 15 is provided as a p-type diffusion layer on the first main surface S1 side of the n-type carrier accumulation layer 2 in the IGBT region 10. The p-type base layer 15 is a semiconductor layer containing, for example, boron or aluminum as p-type impurities, and a concentration of the p-type impurities is $1.0\times10^{12}/cm^3$ or more and $1.0\times10^{19}/cm^3$ or less. The p-type base layer 15 is in contact with the gate trench insulating film 11*b* of the active trench gate 11. On the first main surface S1 side of the p-type base layer 15 in the IGBT region 10, an n+ type source layer 13 is provided in contact with the gate trench insulating film 11*b* of the active trench gate 11, and the p+ type contact layer 14 is provided in the remaining region. The n+ type source layer 13 and the p+ type contact layer 14 form the first main surface S1 of the semiconductor substrate 50. Note that the p+ type contact layer 14 is a region having a higher p-type impurity concentration than the p-type base layer 15. When the p+ type contact layer 14 and the p-type base layer 15 need to be distinguished from each other, each of them may be referred to separately. The p+ type contact layer 14 and the p-type base layer 15 may be collectively referred to as a p-type base layer.

On the second main surface S2 side of the n-type drift layer 1 in the IGBT region 10, an n-type buffer layer 3 having a higher n-type impurity concentration than the n-type drift layer 1 is provided. The n-type buffer layer 3 suppresses punch-through of a depletion layer stretching from the p-type base layer 15 to the second main surface S2 side when the RC-IGBT 101 or 102 is in an off state. The n-type buffer layer 3 is formed by injecting one or both of phosphorus (P) and proton (H+), for example. The concentration of n-type impurities in the n-type buffer layer 3 is $1.0\times10^{12}/cm^3$ or more and $1.0\times10^{18}/cm^3$ or less. Note that the RC-IGBT 101 or 102 does not necessarily include the n-type buffer layer 3. In this case, the n-type drift layer 1 is also provided in a region of the n-type buffer layer 3 illustrated in FIG. 4. The n-type buffer layer 3 and the n-type drift layer 1 may be collectively referred to as the drift layer.

The p-type collector layer 16 is provided on the second main surface S2 side of the n-type buffer layer 3 in the IGBT region 10. That is, the p-type collector layer 16 is provided between the n-type drift layer 1 and the second main surface S2. The p-type collector layer 16 is a semiconductor layer containing, for example, boron or aluminum as p-type impurities, and a concentration of the p-type impurities is $1.0\times10^{16}/cm^3$ or more and $1.0\times10^{20}/cm^3$ or less. The p-type collector layer 16 forms the second main surface S2 of the semiconductor substrate 50. The p-type collector layer 16 is provided not only in the IGBT region 10 but also in the termination region 30, and a portion of the p-type collector layer 16 provided in the termination region 30 forms a p-type termination collector layer 16*a* (see FIGS. 10 and 11). In addition, the p-type collector layer 16 may be provided so as to partially protrude from the IGBT region 10 to the diode region 20 (see FIG. 9).

The trenches that penetrate the p-type base layer 15 from the first main surface S1 of the semiconductor substrate 50 to reach the n-type drift layer 1 are formed in the IGBT region 10. The gate trench electrode 11*a* is provided in the trench with the gate trench insulating film 11*b* interposed therebetween, thereby forming the active trench gate 11. The gate trench electrode 11*a* is opposite to the n-type drift layer 1 across the gate trench insulating film 11*b*. In addition, the dummy trench electrode 12*a* is provided in the trench with the dummy trench insulating film 12*b* interposed therebetween, thereby forming the dummy trench gate 12. The dummy trench electrode 12*a* is opposite to the n-type drift layer 1 across the dummy trench insulating film 12*b*. The gate trench insulating film 11*b* of the active trench gate 11 is in contact with the p-type base layer 15 and the n+ type source layer 13. When the gate drive voltage is applied to the gate trench electrode 11*a*, a channel is formed in the p-type base layer 15 in contact with the gate trench insulating film 11*b* of the active trench gate 11.

An interlayer insulating film 4 is provided on the gate trench electrode 11*a* of the active trench gate 11. A barrier metal 5 is formed on a region of the first main surface S1 of the semiconductor substrate 50 where the interlayer insulating film 4 is not provided and on the interlayer insulating film 4. The barrier metal 5 may be, for example, a conductor containing titanium (Ti), titanium nitride, or TiSi obtained by alloying titanium and silicon (Si). The barrier metal 5 is in ohmic contact with the n+ type source layer 13, the p+ type contact layer 14, and the dummy trench electrode 12*a*, and is electrically connected to the n+ type source layer 13, the p+ type contact layer 14, and the dummy trench electrode 12*a*.

The emitter electrode 6 is provided on the barrier metal 5 in the IGBT region 10. The emitter electrode 6 may be made of, for example, an aluminum alloy such as an aluminum silicon alloy (Al—Si alloy). Alternatively, the emitter electrode 6 may have a configuration in which a plating film is formed by electroless plating or electrolytic plating on an electrode made of an aluminum alloy. Here, the plating film may be, for example, a nickel (Ni) plating film. In a case where there is a fine region between adjacent interlayer insulating films 4 or the like and it is difficult to obtain favorable embedding with the emitter electrode 6 in the region, tungsten having better embedding properties than the emitter electrode 6 may be arranged in the region, and the emitter electrode 6 may be provided on the tungsten.

Note that the barrier metal 5 is not necessarily provided in the IGBT region 10. In this case, the emitter electrode 6 is directly provided on the n+ type source layer 13, the p+ type contact layer 14, and the dummy trench electrode 12*a*. In addition, the barrier metal 5 may be provided only on an n-type semiconductor layer such as the n+ type source layer 13. The barrier metal 5 and the emitter electrode 6 may be collectively referred to as an emitter electrode. FIG. 4 illustrates a configuration in which the interlayer insulating film 4 is not provided on the dummy trench electrode 12*a* of the dummy trench gate 12. However, the interlayer insulating film 4 may be formed on the dummy trench electrode 12*a* of the dummy trench gate 12. In this case, it is sufficient for the emitter electrode 6 and the dummy trench electrode 12*a* to be electrically connected in a section different from a section illustrated in FIG. 4.

A collector electrode 7 is provided on the second main surface S2 side of the p-type collector layer 16 in the IGBT region 10. The collector electrode 7 may be made of an aluminum alloy or an aluminum alloy and a plating film, which is similar to the emitter electrode 6. In addition, the collector electrode 7 may have a configuration different from that of the emitter electrode 6. The collector electrode 7 is in ohmic contact with the p-type collector layer 16 and is electrically connected to the p-type collector layer 16.

A cross-sectional configuration of the IGBT region 10 illustrated in FIG. 5 is different from a cross-sectional configuration of the IGBT region 10 illustrated in FIG. 4 in that the n+ type source layer 13 is not provided on the first main surface S1 side of the semiconductor substrate 50. That is, the n+ type source layer 13 is selectively provided on the first main surface S1 side of a p-type base layer as illustrated in FIG. 3. Note that the p-type base layer referred to here is a combination of the p-type base layer 15 and the p+ type contact layer 14.

(4) Diode Region

Figure 6:
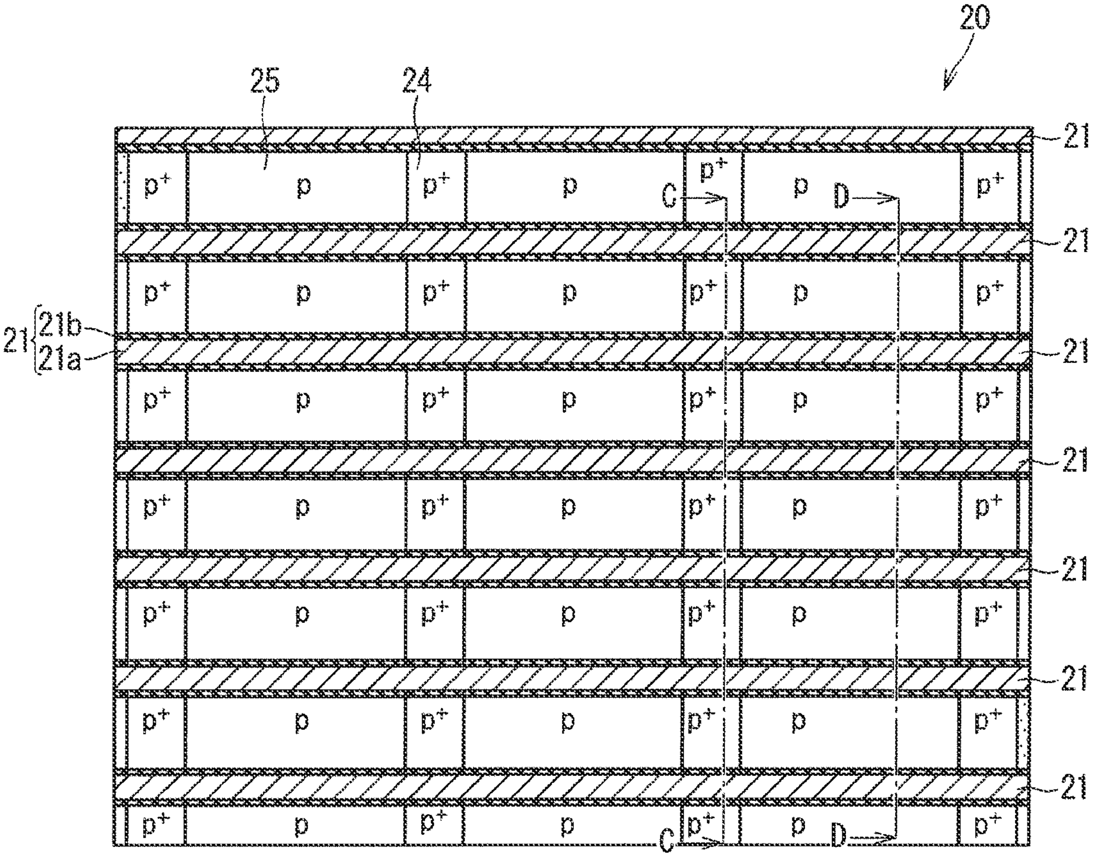
FIG. 6 is a plan view of a diode region of the RC-IGBT.
Figure 7:
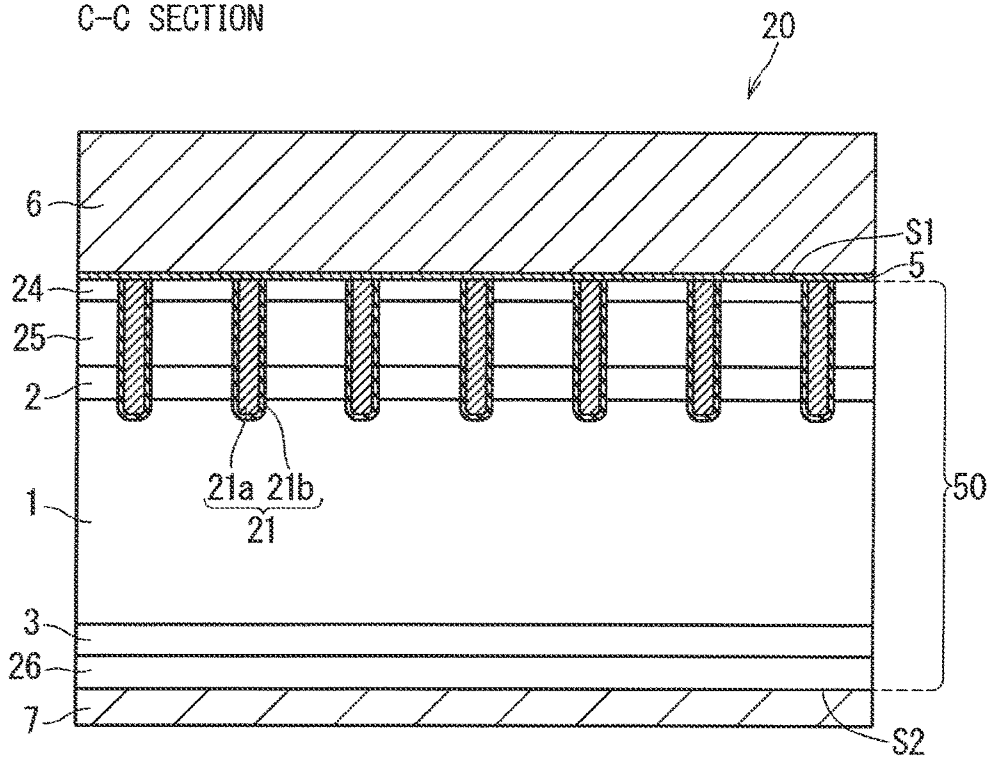
FIG. 7 is a cross-sectional view of the diode region of the RC-IGBT taken along line C-C in FIG. 6.
Figure 8:
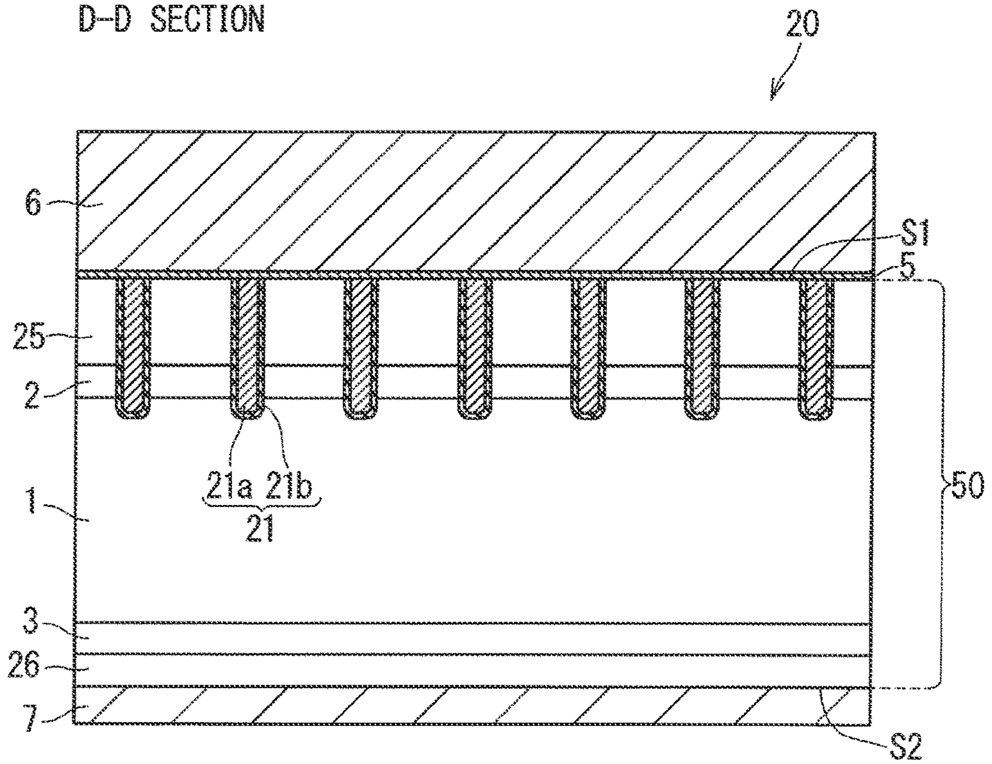
FIG. 8 is a cross-sectional view of the diode region of the RC-IGBT taken along line D-D in FIG. 6.

FIG. 6 is a partially enlarged plan view illustrating a configuration of a region surrounded by a broken line 83 in FIG. 1 in the diode region 20 of the RC-IGBT 101 or 102. FIG. 7 is a cross-sectional view of the diode region 20 of the RC-IGBT 101 or 102 taken along line C-C in FIG. 6. FIG. 8 is a cross-sectional view of the diode region 20 of the RC-IGBT 101 or 102 taken along line D-D in FIG. 6.

As illustrated in FIG. 6, a diode trench gate 21 extends from one end side to the opposite end side of the diode region 20, which is the cell region, along the front surface of the RC-IGBT 101 or 102. The diode trench gate 21 is configured by providing a diode trench electrode 21*a* in a trench formed in the semiconductor substrate 50 of the diode region 20 with a diode trench insulating film 21*b* interposed therebetween. The diode trench electrode 21*a* is opposite to the n-type drift layer 1 across the diode trench insulating film 21*b*. A p+ type contact layer 24 and a p-type anode layer 25 are provided between the two adjacent diode trench gates 21. The p-type anode layer 25 is a p-type diffusion layer. The p+ type contact layer 24 is a semiconductor layer containing, for example, boron or aluminum as p-type impurities, and a concentration of the p-type impurities is $1.0\times10^{15}/cm^3$ or more and $1.0\times10^{20}/cm^3$ or less. The p-type anode layer 25 is a semiconductor layer containing, for example, boron or aluminum as p-type impurities, and a concentration of the p-type impurities is $1.0\times10^{12}/cm^3$ or more and $1.0\times10^{19}/cm^3$ or less. The p+ type contact layer 24 and the p-type anode layer 25 are alternately provided in a longitudinal direction of the diode trench gate 21.

As illustrated in FIG. 7, the RC-IGBT 101 or 102 includes the n-type drift layer 1 formed of the semiconductor substrate 50 in the diode region 20 as in the IGBT region 10. The n-type drift layer 1 in the diode region 20 is formed continuously and integrally with the n-type drift layer 1 in the IGBT region 10, and the both are formed of the same semiconductor substrate 50. In FIG. 7, a range from the p+ type contact layer 24 to the n+ type cathode layer 26 is the semiconductor substrate 50. In FIG. 7, an upper end of the p+ type contact layer 24 is referred to as the first main surface S1 of the semiconductor substrate 50, and a lower end of the n+ type cathode layer 26 is referred to as the second main surface S2 of the semiconductor substrate 50. The first main surface S1 of the diode region 20 and the first main surface S1 of the IGBT region 10 are flush, and the second main surface S2 of the diode region 20 and the second main surface S2 of the IGBT region 10 are flush.

As illustrated in FIG. 7, also in the diode region 20, the n-type carrier accumulation layer 2 is provided on the first main surface S1 side of the n-type drift layer 1, and the n-type buffer layer 3 is provided on the second main surface S2 side of the n-type drift layer 1, which is similar to the IGBT region 10. The n-type carrier accumulation layer 2 and the n-type buffer layer 3 provided in the diode region 20 have the same configurations as the n-type carrier accumulation layer 2 and the n-type buffer layer 3 provided in the IGBT region 10. Note that the n-type carrier accumulation layer 2 is not necessarily provided in the IGBT region 10 and the diode region 20. In addition, the n-type carrier accumulation layer 2 may be provided only in the IGBT region 10. The n-type drift layer 1, the n-type carrier accumulation layer 2, and the n-type buffer layer 3 may be collectively referred to as the drift layer also in the diode region 20, similarly to the IGBT region 10.

The p-type anode layer 25 is provided on the first main surface S1 side of the n-type carrier accumulation layer 2 in the diode region 20. The p-type anode layer 25 is provided between the n-type drift layer 1 and the first main surface S1 of the semiconductor substrate 50. The p-type impurity concentration of the p-type anode layer 25 may be the same as the p-type impurity concentration of the p-type base layer 15 in the IGBT region 10. In that case, it is possible to simultaneously form the p-type anode layer 25 and the p-type base layer 15. Alternatively, the p-type impurity concentration of the p-type anode layer 25 may be lower than the p-type impurity concentration of the p-type base layer 15 in the IGBT region 10. As a result, the number of holes injected into the diode region 20 during a diode operation of the RC-IGBT 101 or 102 decreases, so that recovery loss during diode operation is reduced.

The p+ type contact layer 24 is provided on the first main surface S1 side of the p-type anode layer 25. The p-type impurity concentration of the p+ type contact layer 24 may be the same as or different from the p-type impurity concentration of the p+ type contact layer 14 in the IGBT region 10. The p+ type contact layer 24 forms the first main surface S1 of the semiconductor substrate 50. The p+ type contact layer 24 has the p-type impurity concentration higher than that of the p-type anode layer 25. When the p+ type contact layer 24 and the p-type anode layer 25 need to be distinguished from each other, each of them may be referred to separately. The p+ type contact layer 24 and the p-type anode layer 25 may be collectively referred to as a p-type anode layer.

The n+ type cathode layer 26 is provided on the second main surface S2 side of the n-type buffer layer 3 in the diode region 20. The n+ type cathode layer 26 is provided between the n-type drift layer 1 and the second main surface S2 of the semiconductor substrate 50. The n+ type cathode layer 26 is a semiconductor layer containing, for example, arsenic or phosphorus as n-type impurities, and a concentration of the n-type impurities is $1.0\times10^{16}/cm^3$ or more and $1.0\times10^{21}/cm^3$ or less. The n+ type cathode layer 26 is provided in a part or a whole of the diode region 20. The n+ type cathode layer 26 forms the second main surface S2 of the semiconductor substrate 50. Although not illustrated, p-type impurities may be further selectively injected into a region where the n+ type cathode layer 26 is formed as described above, and a p-type cathode layer may be provided using a part of the region where the n+ type cathode layer 26 is formed as the p-type semiconductor.

As illustrated in FIG. 7, a trench that penetrates the p-type anode layer 25 from the first main surface S1 of the semiconductor substrate 50 to reach the n-type drift layer 1 is formed in the diode region 20 of the RC-IGBT 101 or 102. The diode trench electrode 21*a* is provided in the trench of the diode region 20 with the diode trench insulating film 21*b* interposed therebetween, thereby forming the diode trench gate 21. The diode trench electrode 21*a* is opposite to the n-type drift layer 1 across the diode trench insulating film 21*b*.

As illustrated in FIG. 7, the barrier metal 5 is provided on the diode trench electrode 21*a* and the p+ type contact layer 24. The barrier metal 5 is in ohmic contact with the diode trench electrode 21*a* and the p+ type contact layer 24, and is electrically connected to the diode trench electrode and the p+ type contact layer 24. The barrier metal 5 of the diode region 20 may have the same configuration as the barrier metal 5 of the IGBT region 10.

The emitter electrode 6 is provided on the barrier metal 5 in the diode region 20. The emitter electrode 6 of the diode region 20 is formed continuously with the emitter electrode 6 of the IGBT region 10. Note that the barrier metal 5 is not necessarily provided in the diode region 20, which is similar to the IGBT region 10. In this case, the diode trench electrode 21*a* and the p+ type contact layer 24 are in ohmic contact with the emitter electrode 6. In a case where the barrier metal 5 is not provided, the p+ type contact layer 24 is not necessarily provided, either, and the p-type anode layer 25 and the emitter electrode 6 may be in ohmic contact with each other.

Note that FIG. 7 illustrates a configuration in which the interlayer insulating film 4 is not provided on the diode trench electrode 21*a* of the diode trench gate 21. However, the interlayer insulating film 4 may be formed on the diode trench electrode 21*a* of the diode trench gate 21. In that case, it is sufficient for the emitter electrode 6 and the diode trench electrode 21*a* to be electrically connected in a section different from a section illustrated in FIG. 7.

The collector electrode 7 is provided on the second main surface S2 side of the n+ type cathode layer 26. The collector electrode 7 of the diode region 20 is formed continuously with the collector electrode 7 of the IGBT region 10, which is similar to the emitter electrode 6. The collector electrode 7 is in ohmic contact with the n+ type cathode layer 26 and is electrically connected to the n+ type cathode layer 26.

A cross-sectional configuration of FIG. 8 is different from a cross-sectional configuration of FIG. 7 in that the p+ type contact layer 24 is not provided between the p-type anode layer 25 and the barrier metal 5, and the p-type anode layer 25 forms the first main surface S1 of the semiconductor substrate 50. That is, the p+ type contact layer 24 is selectively provided on the first main surface S1 side of the p-type anode layer 25 as illustrated in FIG. 6.

(5) Boundary Between IGBT Region and Diode Region

Figure 9:
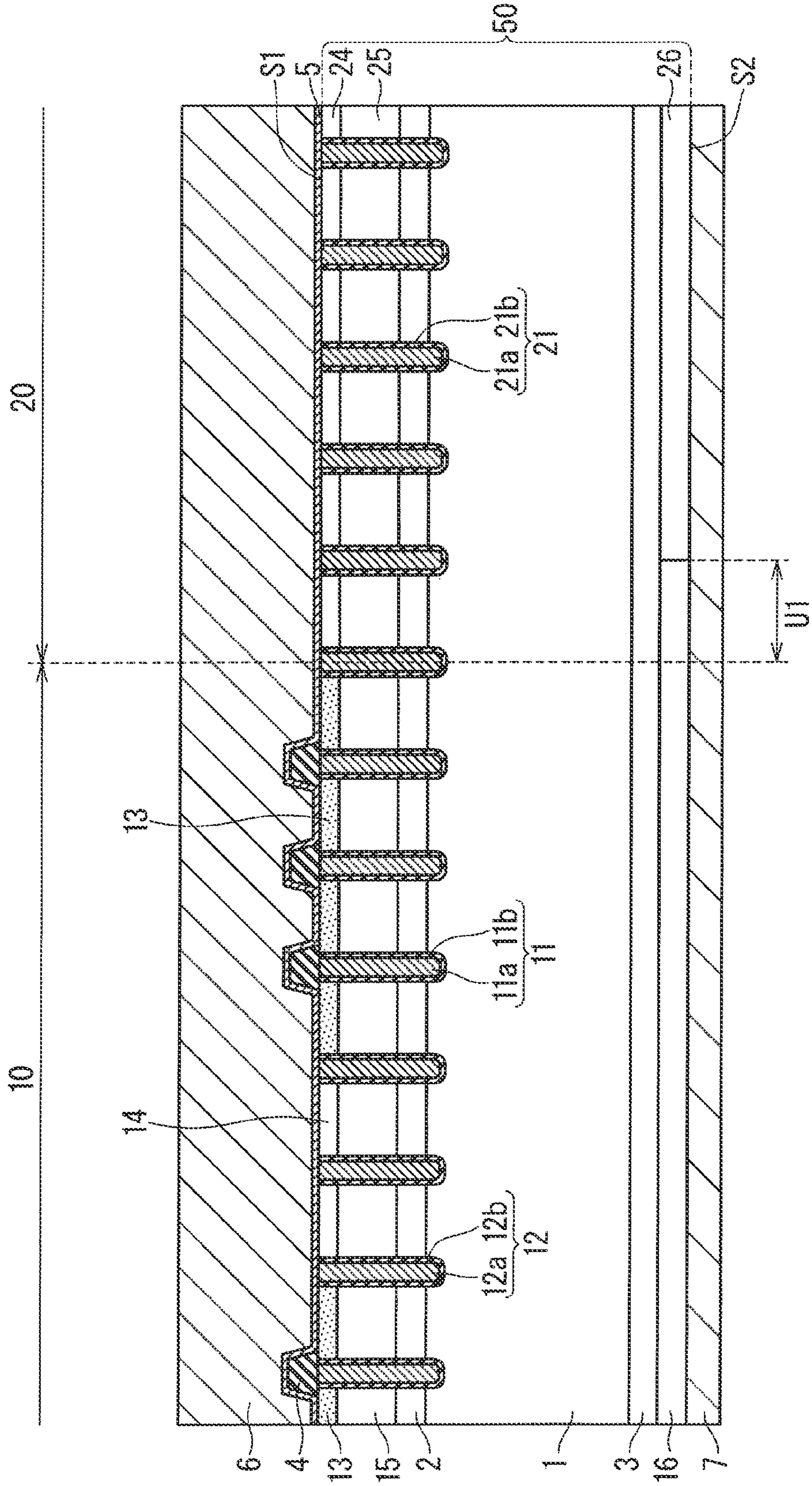
FIG. 9 is a cross-sectional view of the RC-IGBT illustrating a configuration of a boundary between an IGBT region and a diode region taken along line G-G in FIG. 1.

FIG. 9 is a cross-sectional view of the RC-IGBT 101 or 102 taken along line G-G in FIG. 1 or 2, and illustrates a configuration of a region of a boundary between the IGBT region 10 and the diode region 20. As illustrated in FIG. 9, the p-type collector layer 16 provided on the second main surface S2 side of the IGBT region 10 protrudes, by a distance U1, toward the diode region 20 side from the boundary between the IGBT region 10 and the diode region 20. As a result, a distance between the active trench gate 11 of the IGBT region 10 and the n+ type cathode layer 26 of the diode region 20 can be increased. As a result, even when the gate drive voltage is applied to the gate trench electrode 11*a* during a freewheeling diode operation of the RC-IGBT 101 or 102, a current can be suppressed from flowing from the channel formed adjacent to the active trench gate 11 of the IGBT region 10 to the n+ type cathode layer 26. The distance U1 is, for example, 100 μm. Note that the distance U1 may be smaller than 100 μm or may be zero depending on the application of the RC-IGBT 101 or 102.

(6) Termination Structure

Figure 10:
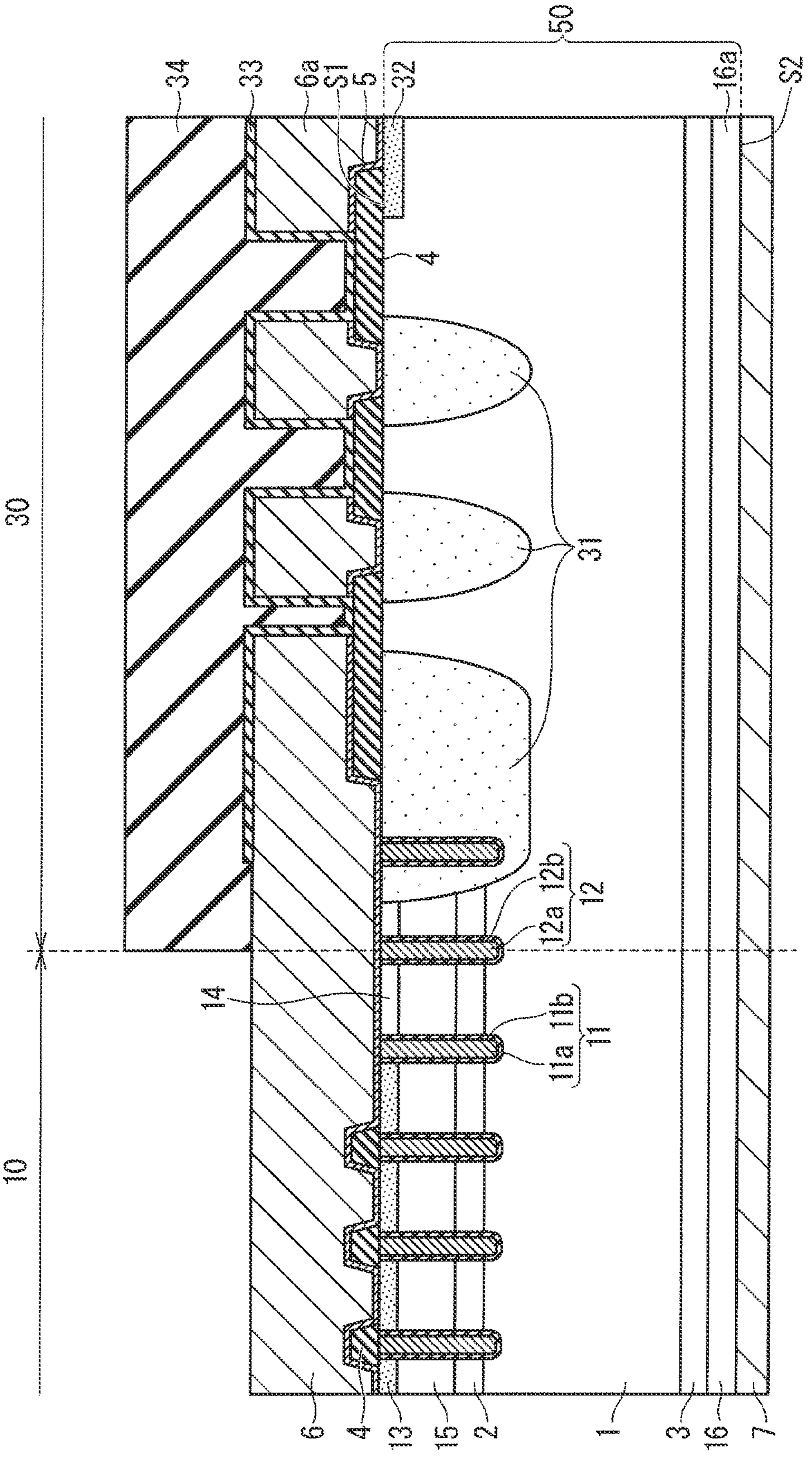
FIG. 10 is a cross-sectional view of the IGBT region and a termination region of the RC-IGBT taken along line E-E in FIG. 1.
Figure 11:
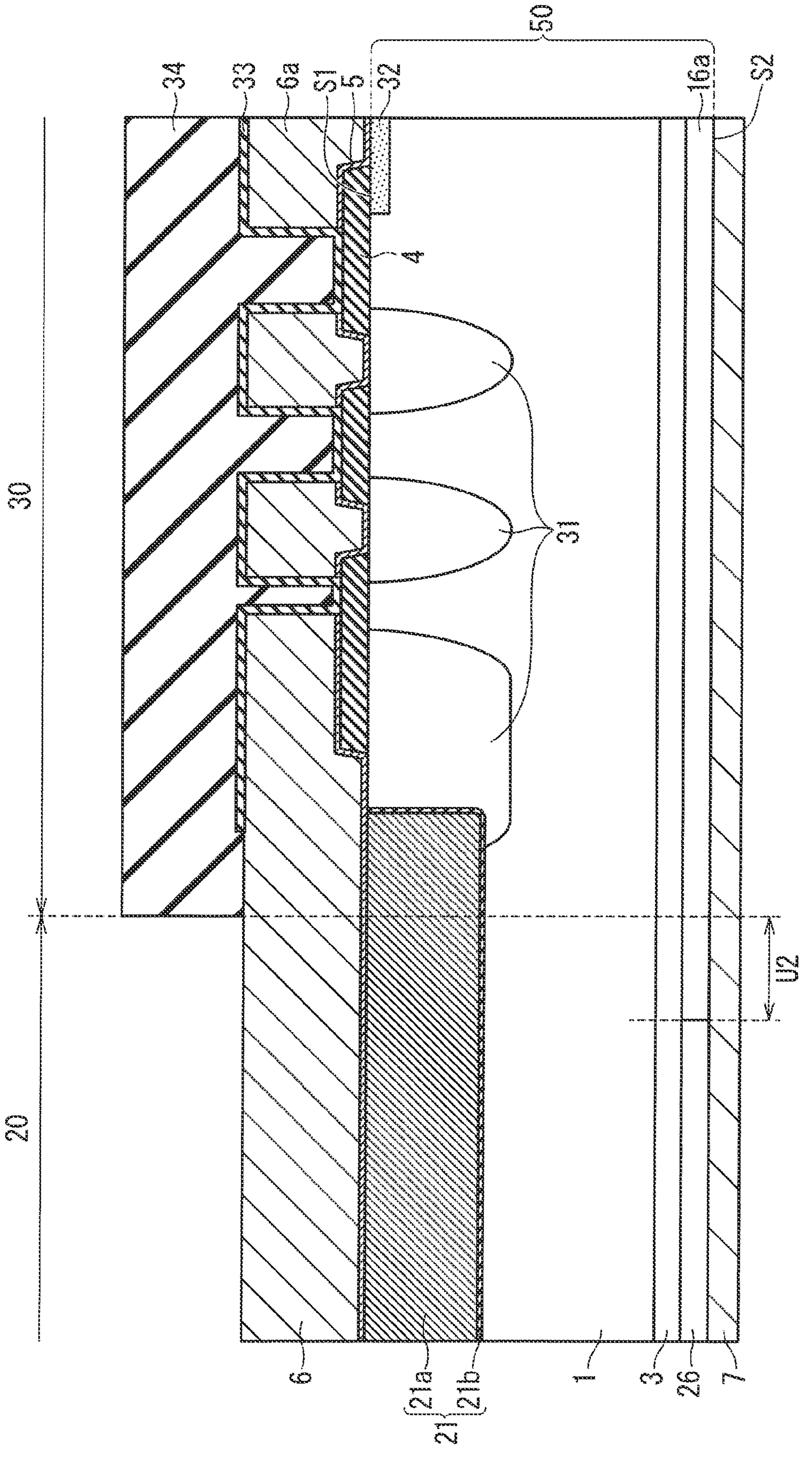
FIG. 11 is a cross-sectional view of the diode region and the termination region of the RC-IGBT taken along line F-F in FIG. 1.

FIG. 10 is a cross-sectional view of the RC-IGBT 101 or 102 taken along line E-E in FIG. 1 or 2, and illustrates a configuration from the IGBT region 10 to the termination region 30. FIG. 11 is a cross-sectional view of the RC-IGBT 101 taken along line F-F in FIG. 1, and illustrates a configuration from the diode region 20 to the termination region 30.

As illustrated in FIGS. 10 and 11, the termination region 30 includes the n-type drift layer 1 between the first main surface S1 and the second main surface S2 of the semiconductor substrate 50. The first main surface S1 and the second main surface S2 of the semiconductor substrate 50 in the termination region 30 are flush with the first main surfaces S1 and the second main surfaces S2 of the semiconductor substrate 50 in the IGBT region 10 and the diode region 20, respectively. In addition, the n-type drift layer 1 in the termination region 30 has the same configuration as the n-type drift layers 1 in the IGBT region 10 and the diode region 20, and is formed continuously and integrally with these.

A p-type termination well layer 31 is provided on the first main surface S1 side of the n-type drift layer 1 in the termination region 30, that is, between the first main surface S1 of the semiconductor substrate 50 and the n-type drift layer 1. The p-type termination well layer 31 is a semiconductor layer containing, for example, boron or aluminum as p-type impurities, and a concentration of the p-type impurities is $1.0\times10^{14}/cm^3$ or more and $1.0\times10^{19}/cm^3$ or less. The p-type termination well layer 31 is provided to surround the cell region including the IGBT region 10 and the diode region 20. A plurality of the p-type termination well layers 31 are provided in a ring shape, and the number of the p-type termination well layers 31 is appropriately selected according to the withstand voltage design of the RC-IGBT 101 or 102. On the further outer edge side of the p-type termination well layer 31, an n+ type channel stopper layer 32 is provided between the first main surface S1 of the semiconductor substrate 50 and the n-type drift layer 1. The n+ type channel stopper layer 32 surrounds the p-type termination well layer 31.

The p-type termination collector layer 16*a* is provided between the n-type drift layer 1 and the second main surface S2 of the semiconductor substrate 50 in the termination region 30. The p-type termination collector layer 16*a* is formed continuously and integrally with the p-type collector layer 16 provided in the cell region. Therefore, the p-type termination collector layer 16*a* may be referred to as the p-type collector layer 16. In the configuration in which the diode region 20 is provided adjacent to the termination region 30 as in the RC-IGBT 101 in FIG. 1, the p-type termination collector layer 16*a* is provided such that an end portion on the diode region 20 side protrudes to the diode region 20 by a distance U2 as illustrated in FIG. 11. As a result, a distance between the n+ type cathode layer 26 of the diode region 20 and the p-type termination well layer 31 of the termination region 30 can be increased. As a result, the p-type termination well layer 31 is suppressed from operating as an anode of a diode. The distance U2 is, for example, 100 μm.

The collector electrode 7 is provided on the second main surface S2 of the semiconductor substrate 50 in the termination region 30. The collector electrode 7 is integrally formed to be continuous from the cell region including the IGBT region 10 and the diode region 20 to the termination region 30. On the other hand, on the first main surface S1 of the semiconductor substrate 50 in the termination region 30, the emitter electrode 6 continuous from the cell region and a termination electrode 6*a* separated from the emitter electrode 6 are provided.

The emitter electrode 6 and the termination electrode 6*a* are electrically connected via a semi-insulating film 33. The semi-insulating film 33 is, for example, semi-insulating silicon nitride (sinSiN). The termination electrode 6*a*, the p-type termination well layer 31, and the n+ type channel stopper layer 32 are electrically connected via a contact hole formed in the interlayer insulating film 4 provided on the first main surface S1 of the semiconductor substrate 50. In addition, in the termination region 30, a termination protective film 34 is provided to cover the emitter electrode 6, the termination electrode 6*a*, and the semi-insulating film 33. The termination protective film 34 is made of polyimide, for example.

B. First Preferred Embodiment

Figure 12:
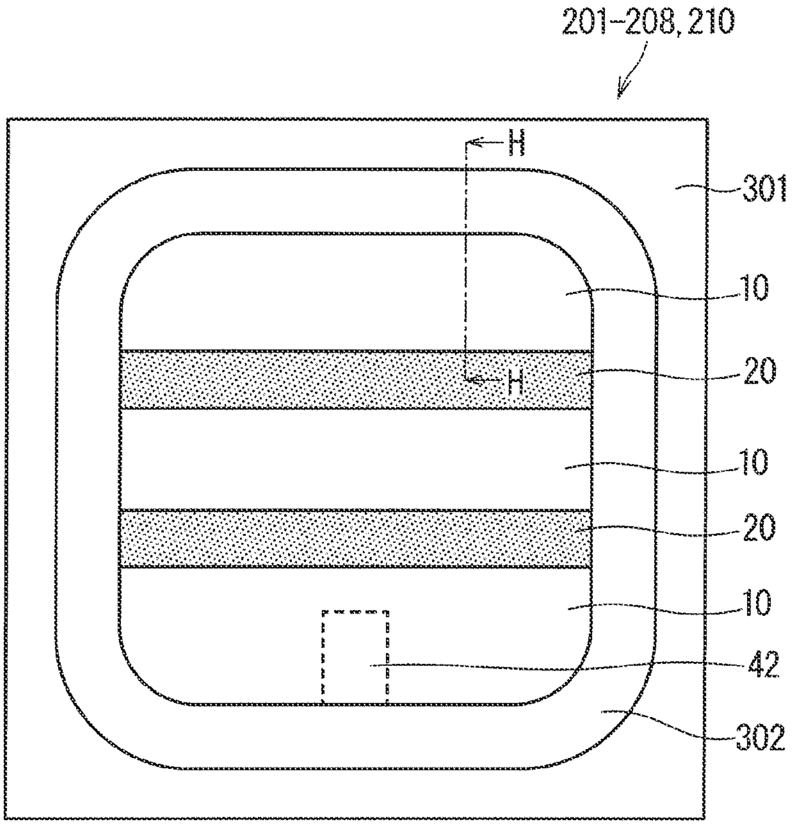
FIG. 12 is a plan view of an RC-IGBT according to first to eighth and tenth preferred embodiments.
Figure 13:
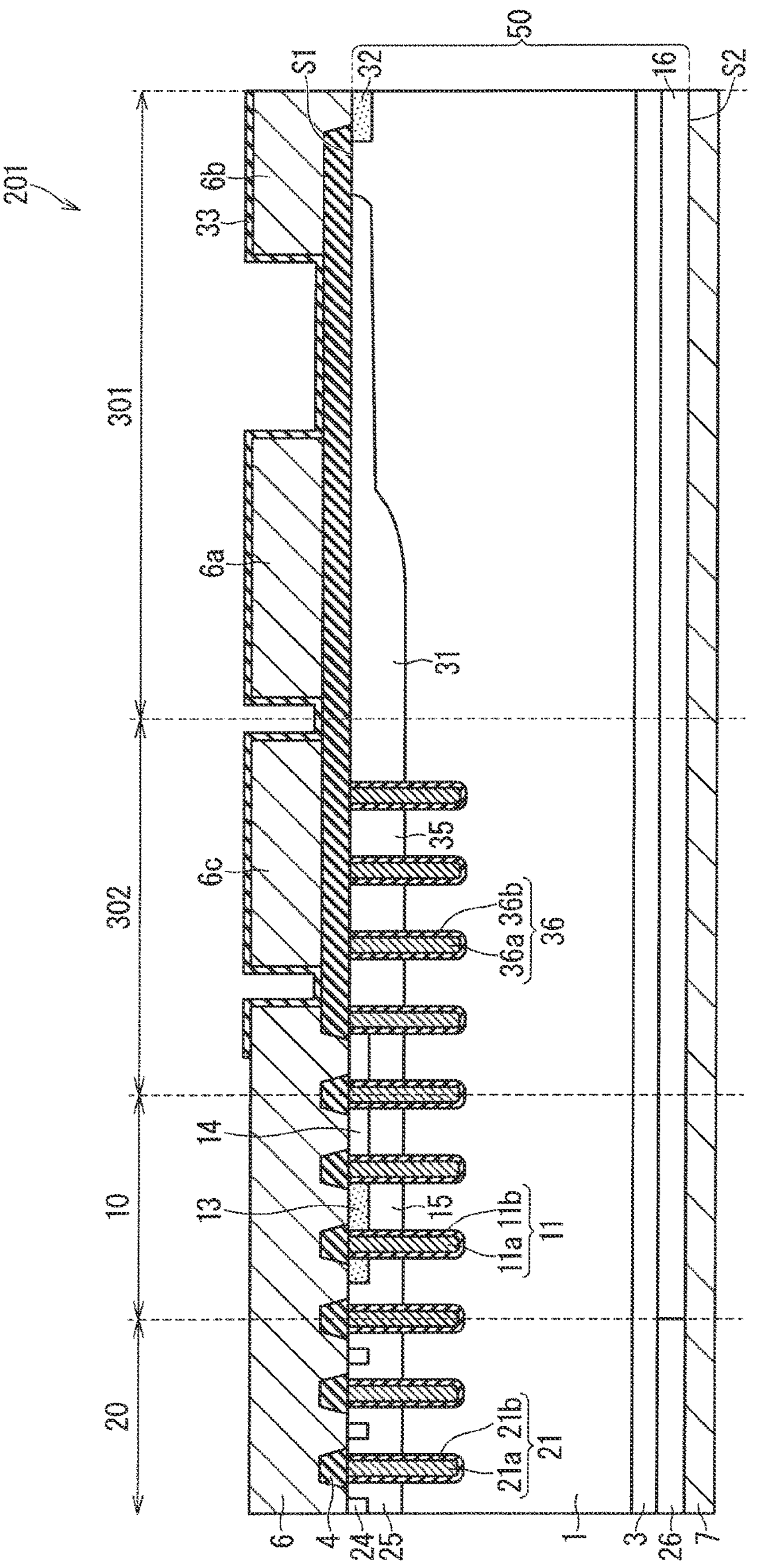
FIG. 13 is a cross-sectional view of the RC-IGBT according to the first preferred embodiment taken along line H-H in FIG. 12.

FIG. 12 is a top view of an RC-IGBT 201 that is a semiconductor device according to a first preferred embodiment. FIG. 13 is a cross-sectional view of the RC-IGBT 201 taken along line H-H in FIG. 12. As compared with the RC-IGBT 101 of the basic technology, the RC-IGBT 201 includes a wiring region 302 and a termination region 301 instead of the termination region 30. In addition, the RC-IGBT 201 includes a signal pad region 42 instead of the control pad 41.

As illustrated in FIG. 12, the RC-IGBT 201 includes the diode region 20, the IGBT region 10, the wiring region 302, and the termination region 301. Configurations of the IGBT region 10 and the diode region 20 in the RC-IGBT 201 are similar to the configurations of the IGBT region 10 and the diode region 20 in the RC-IGBT 101. The wiring region 302 and the termination region 301 correspond to the termination region 30 in FIG. 1. The wiring region 302 is provided to surround a cell region including the IGBT region 10 and the diode region 20. The termination region 301 is provided to surround the wiring region 302.

The RC-IGBT 201 includes the n-type drift layer 1 formed of the semiconductor substrate 50 in the wiring region 302. The first main surface S1 and the second main surface S2 of the semiconductor substrate 50 in the wiring region 302 are the same as the first main surfaces S1 and the second main surfaces S2 of the semiconductor substrate 50 in the IGBT region 10 and the diode region 20, respectively. The n-type drift layer 1 of the wiring region 302 has the same configuration as the n-type drift layers 1 in the IGBT region 10 and the diode region 20, and is formed continuously and integrally with these.

A p-type wiring well layer 35 is provided on the first main surface S1 side of the n-type drift layer 1 in the wiring region 302, that is, between the first main surface S1 of the semiconductor substrate 50 and the n-type drift layer 1. A configuration on the second main surface S2 side of the n-type drift layer 1 in the wiring region 302 is similar to the configuration on the second main surface S2 side of the n-type drift layer 1 in the IGBT region 10.

In the wiring region 302, a trench that penetrates the p-type wiring well layer 35 from the first main surface S1 of the semiconductor substrate 50 to reach the n-type drift layer 1 is formed. A wiring trench electrode 36*a* is provided in the trench with a wiring trench oxide film 36*b* interposed therebetween, thereby forming a wiring trench gate 36. The wiring trench gate 36 is deeper than the p-type base layer 15 in the IGBT region 10. The wiring trench electrode 36*a* is opposite to the n-type drift layer 1 across the wiring trench oxide film 36*b*. The wiring trench oxide film 36*b* is in contact with the p-type wiring well layer 35 and the n-type drift layer 1.

In the wiring region 302, the interlayer insulating film 4 is provided on the first main surface S1 of the semiconductor substrate 50. In addition, a wiring electrode 6*c* is provided on the interlayer insulating film 4 of the wiring region 302. The wiring electrode 6*c* and the emitter electrode 6 in the cell region are electrically connected via the semi-insulating film 33. Note that the wiring trench gate 36, the active trench gate 11, the dummy trench gate 12, and the diode trench gate 21 are also collectively referred to as a trench gate.

The RC-IGBT 201 includes the n-type drift layer 1 formed of the semiconductor substrate 50 in the termination region 301. The first main surface S1 and the second main surface S2 of the semiconductor substrate 50 in the termination region 301 are the same as the first main surfaces S1 and the second main surfaces S2 of the semiconductor substrate 50 in the cell region and the wiring region 302, respectively. The n-type drift layer 1 in the termination region 301 has the same configuration as the n-type drift layer 1 in the cell region, and is formed continuously and integrally with the n-type drift layer 1.

The p-type termination well layer 31 is provided on the first main surface S1 side of the n-type drift layer 1 in the termination region 301, that is, between the first main surface S1 of the semiconductor substrate 50 and the n-type drift layer 1. The p-type termination well layer 31 in the termination region 301 is formed continuously with the p-type wiring well layer 35 in the wiring region 302. On the further outer edge side of the p-type termination well layer 31 in the termination region 301, the n+ type channel stopper layer 32 is provided between the first main surface S1 of the semiconductor substrate 50 and the n-type drift layer 1. The n+ type channel stopper layer 32 surrounds the p-type termination well layer 31. A configuration on the second main surface S2 side of the n-type drift layer 1 in the termination region 301 is similar to the configuration on the second main surface S2 side of the n-type drift layer 1 in each of the IGBT region 10 and the wiring region 302.

The termination electrode 6*a* and a channel stopper electrode 6*b* are provided on the first main surface S1 of the semiconductor substrate 50 in the termination region 301 across the interlayer insulating film 4. The channel stopper electrode 6*b* is electrically connected to the channel stopper layer. The emitter electrode 6 in the cell region, the wiring electrode 6*c* in the wiring region 302, the termination electrode 6*a* in the termination region 301, and the channel stopper electrode 6*b* are electrically connected via the semi-insulating film 33. Although the termination protective film 34 is not illustrated in FIG. 12, the termination protective film 34 may be formed or is not necessarily formed.

In the RC-IGBT 201, maximum depths of the p-type anode layer 25, the p-type wiring well layer 35, and the p-type termination well layer 31 are equal to or less than a depth of the p-type base layer 15. That is, the depth of the p-type base layer 15 is less than depths of the active trench gate 11, the dummy trench gate 12, the diode trench gate 21, and the wiring trench gate 36, and is equal to or more than depths of the p-type anode layer 25, the p-type wiring well layer 35, and the p-type termination well layer 31. As a result, the p-type anode layer 25, the p-type base layer 15, the p-type wiring well layer 35, and the p-type termination well layer 31 can be simultaneously formed, and manufacturing cost of the RC-IGBT 201 is significantly reduced.

In the RC-IGBT 201, an integrated concentration, which is an integrated value per unit area in a plan view seen from a top surface of a chip, of the p-type impurity concentration of the p-type anode layer 25 may be lower than an integrated concentration of the p-type base layer 15. It is possible to suppress a recovery current of a diode and accompanying energy loss without affecting withstand voltage characteristics by lowering the p-type impurity concentration of the p-type anode layer 25.

The RC-IGBT 201 may be configured such that an electric field generated when a high-voltage reverse bias is applied between the emitter electrode 6 and the collector electrode 7 is the highest in the wiring region 302. As a result, a withstand voltage can be designed and controlled in the wiring region 302 where the withstand voltage is likely to be the lowest.

C. Second Preferred Embodiment

Figure 14:
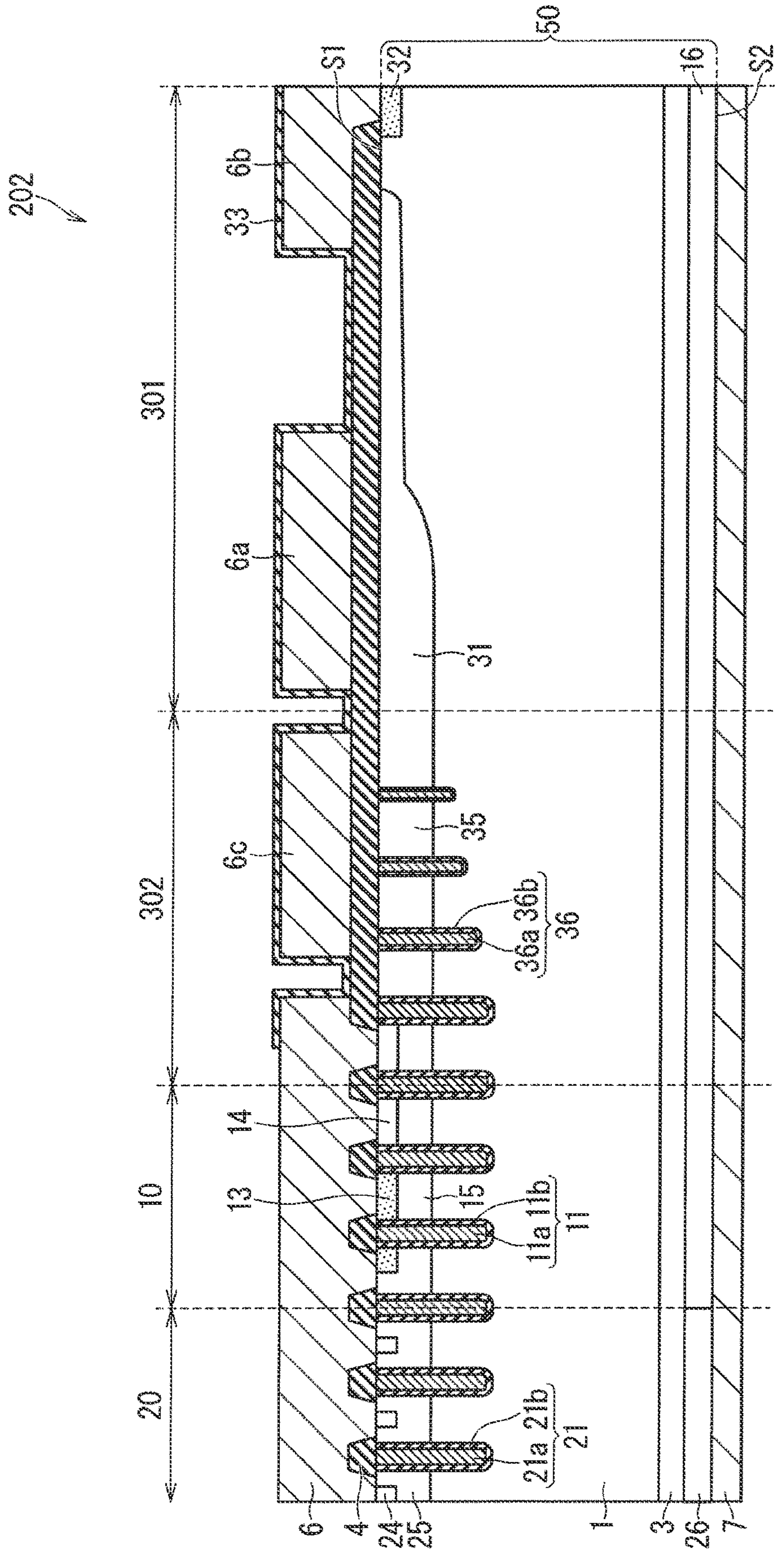
FIG. 14 is a cross-sectional view of the RC-IGBT according to the second preferred embodiment taken along the line H-H in FIG. 12.

FIG. 14 is a cross-sectional view of an RC-IGBT 202 that is a semiconductor device according to a second preferred embodiment. A top view of the RC-IGBT 202 is the same as illustrated in FIG. 12. FIG. 14 is a cross-sectional view of the RC-IGBT 202 taken along the line H-H in FIG. 12. Hereinafter, differences of the RC-IGBT 202 from the RC-IGBT 201 according to the first preferred embodiment will be described.

In the RC-IGBT 202, a trench depth of at least one wiring trench gate 36 is shallower than trench depths of the diode trench gate 21 and the active trench gate. A withstand voltage of the RC-IGBT 202 is determined by an electric field at the bottom of the wiring trench gate 36. Therefore, when the trench depth of the wiring trench gate 36 is made shallow, an electric field in the wiring region 302 is relaxed, and the withstand voltage is secured.

In the RC-IGBT 202, the trench depth of the wiring trench gate 36 gradually decreases from the center toward the outer periphery of the semiconductor substrate 50. As a result, the electric field in the wiring region 302 is relaxed.

In the RC-IGBT 202, the wiring trench gate 36 is formed such that a trench width is narrower as the trench depth is shallower. In other words, the wiring trench gate 36 includes a first wiring trench gate and a second wiring trench gate deeper than the first wiring trench gate, and a width of the first wiring trench gate is smaller than a width of the second wiring trench gate. With such a configuration, the trench depth of the wiring trench gate 36 can be easily controlled using a loading effect of etching. Therefore, the configuration in which the trench depth of the wiring trench gate 36 gradually decreases toward the outer periphery of the semiconductor substrate 50 can be realized without a cost increase due to an additional process.

D. Third Preferred Embodiment

Figure 15:
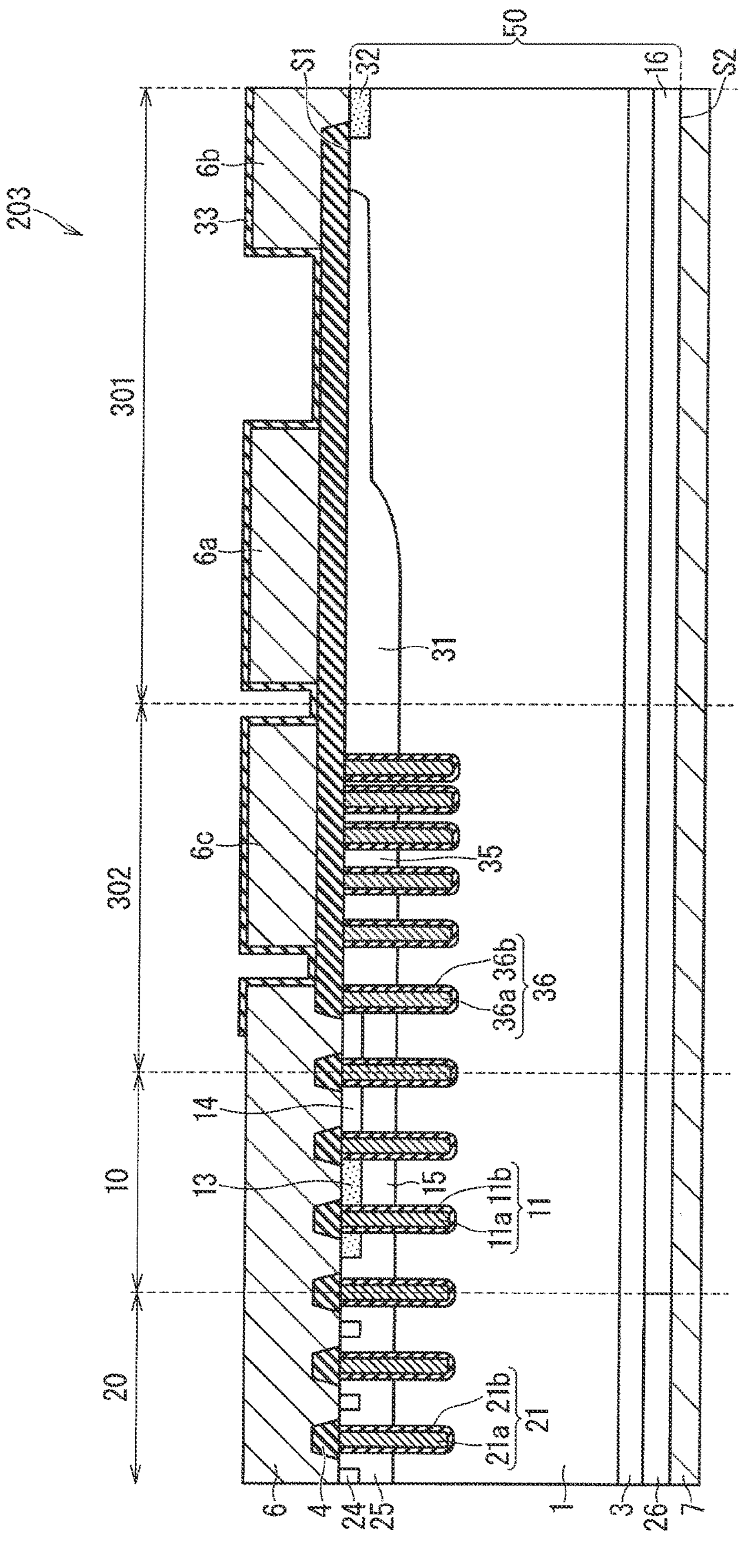
FIG. 15 is a cross-sectional view of the RC-IGBT according to the third preferred embodiment taken along the line H-H in FIG. 12.

FIG. 15 is a cross-sectional view of an RC-IGBT 203 that is a semiconductor device according to a third preferred embodiment. A top view of the RC-IGBT 203 is the same as illustrated in FIG. 12. FIG. 15 is a cross-sectional view of the RC-IGBT 203 taken along the line H-H in FIG. 12. Hereinafter, differences of the RC-IGBT 203 from the RC-IGBT 201 according to the first preferred embodiment will be described.

In the RC-IGBT 203, at least one pitch of the wiring trench gates 36 is narrower than a pitch of the active trench gates 11 in the IGBT region 10. A withstand voltage of the RC-IGBT 203 is determined by an electric field at the bottom of the wiring trench gate 36, and thus, when the pitch of at least some of the wiring trench gates 36 is made narrow, an electric field in the wiring region 302 is relaxed, and the withstand voltage of the RC-IGBT 203 is secured.

In the RC-IGBT 203, the pitches of the wiring trench gates 36 gradually decrease from the center toward the outer periphery of the RC-IGBT 203. The electric field in the wiring region 302 can be relaxed by gradually decreasing the pitches of the wiring trench gates 36.

E. Fourth Preferred Embodiment

Figure 16:
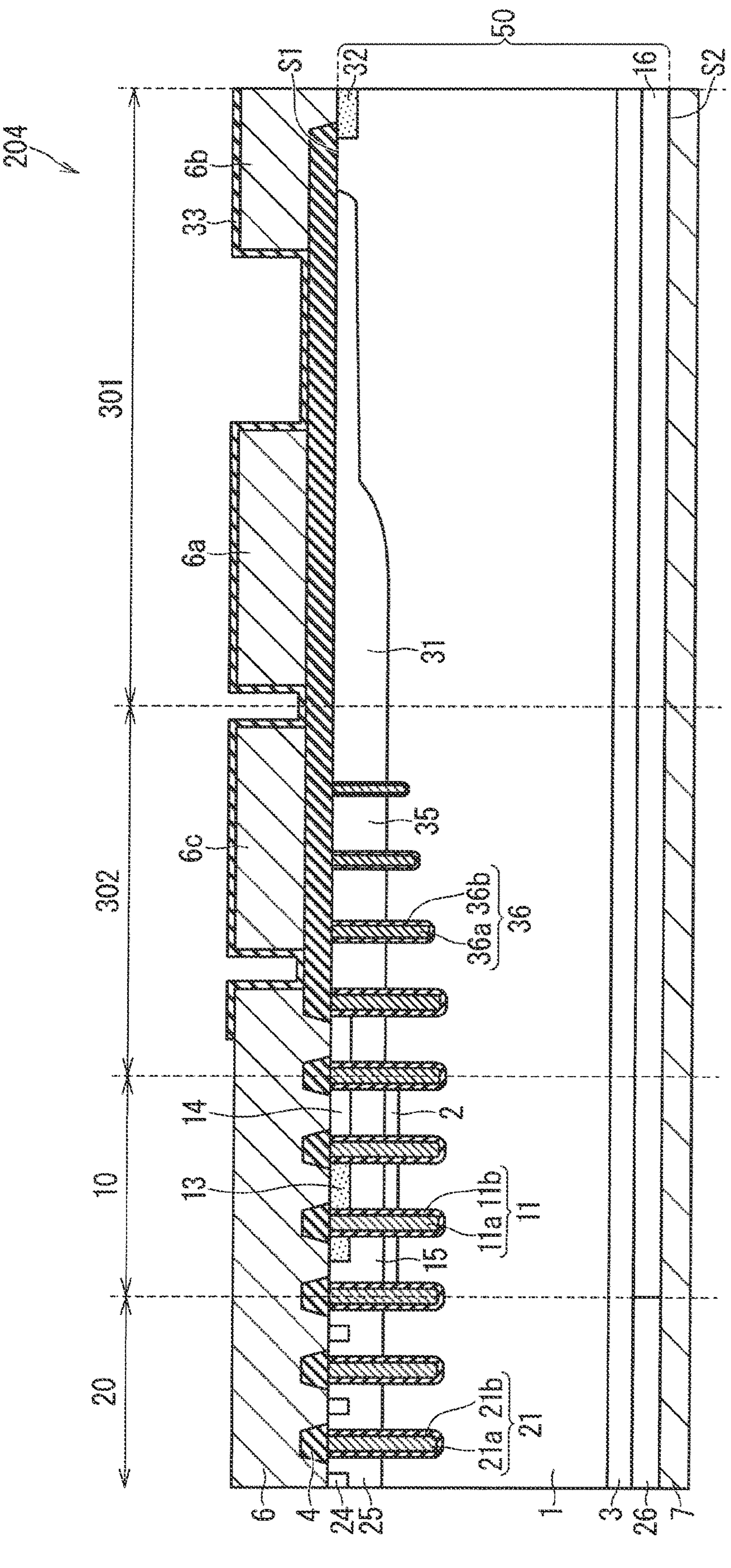
FIG. 16 is a cross-sectional view of the RC-IGBT according to the fourth preferred embodiment taken along the line H-H in FIG. 12.

FIG. 16 is a cross-sectional view of an RC-IGBT 204 that is a semiconductor device according to a fourth preferred embodiment. A top view of the RC-IGBT 204 is the same as illustrated in FIG. 12. FIG. 16 is a cross-sectional view of the RC-IGBT 204 taken along the line H-H in FIG. 12. Hereinafter, differences of the RC-IGBT 204 from the RC-IGBT 201 according to the first preferred embodiment will be described.

In the RC-IGBT 204, the n-type carrier accumulation layer 2 is provided only in the IGBT region 10 on the first main surface S1 side of the n-type drift layer 1. As a result, it is possible to improve loss of the IGBT while suppressing a decrease in a withstand voltage due to the n-type carrier accumulation layer 2. Here, the p-type base layer 15 may have a depth less than or equal to a depth of the p-type wiring well layer 35. In other words, the p-type wiring well layer 35 may have a depth less than depths of the plurality of active trench gates 11 and more than the depth of the p-type base layer 15. Even such a structure allows simultaneous formation of the p-type anode layer 25, the p-type base layer 15, the p-type wiring well layer 35, and the p-type termination well layer 31. Thus, the manufacturing cost of the RC-IGBT 201 is significantly reduced. In the RC-IGBT 204, the n-type carrier accumulation layer 2 may be formed partly or entirely in the diode region 20.

F. Fifth Preferred Embodiment

Figure 17:
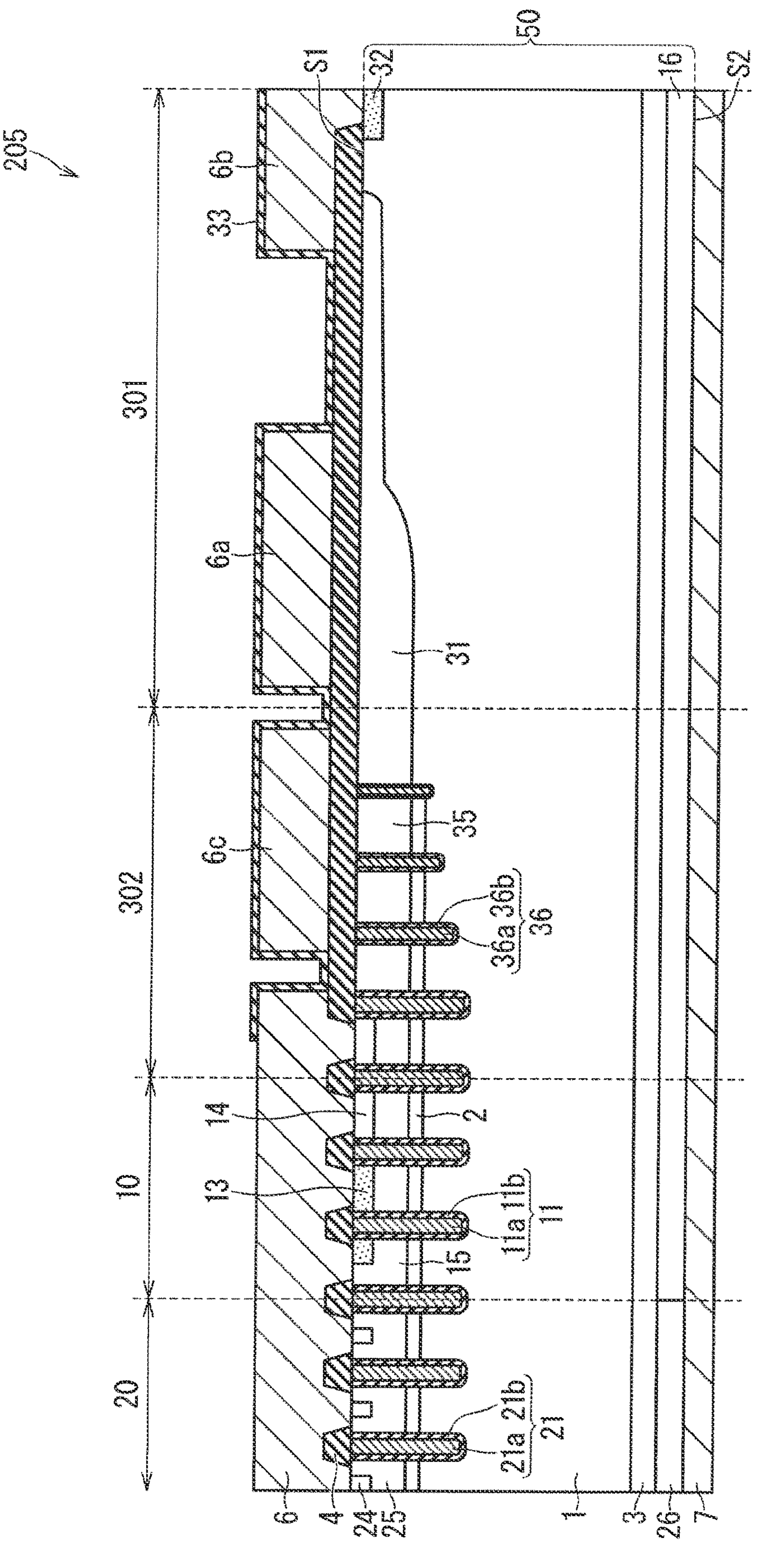
FIG. 17 is a cross-sectional view of the RC-IGBT according to the fifth preferred embodiment taken along the line H-H in FIG. 12.

FIG. 17 is a cross-sectional view of an RC-IGBT 205 that is a semiconductor device according to a fifth preferred embodiment. A top view of the RC-IGBT 205 is the same as illustrated in FIG. 12. FIG. 17 is a cross-sectional view of the RC-IGBT 204 taken along the line H-H in FIG. 12. Hereinafter, differences of the RC-IGBT 205 from the RC-IGBT 204 according to the fourth preferred embodiment will be described.

In the RC-IGBT 205, the n-type carrier accumulation layer 2 is arranged within 1 μm from each of the active trench gate 11, the diode trench gate 21, and the wiring trench gate 36 in the IGBT region 10, the diode region 20, and the wiring region 302. Although the n-type carrier accumulation layer 2 is formed in the diode region 20 and the wiring region 302 in FIG. 17, the n-type carrier accumulation layer 2 may be formed partly or entirely in the diode region 20 and the wiring region 302, or need not be formed. As a result, it is possible to improve loss of the IGBT while suppressing a decrease in a withstand voltage due to the n-type carrier accumulation layer 2. When the n-type carrier accumulation layer 2 is formed partly in the diode region 20 and the wiring region 302, the maximum depth of the p-type wiring well layer 35 may be less than the depths of the plurality of active trench gates 11, and more than or equal to the depth of the p-type base layer 15. Furthermore, when the n-type carrier accumulation layer 2 is formed entirely in the diode region 20 and the wiring region 302, the depths of the p-type base layer 15 and the p-type wiring well layer 35 may be less than the maximum depth of the p-type termination well layer 31. In other words, a depth of the deepest portion of the p-type termination well layer 31 may be less than the depths of the plurality of active trench gates 11, and more than or equal to the depths of the p-type base layer 15 and the p-type wiring well layer 35. Even such a structure allows simultaneous formation of the p-type anode layer 25, the p-type base layer 15, the p-type wiring well layer 35, and the p-type termination well layer 31. Thus, the manufacturing cost of the RC-IGBT 201 is significantly reduced. Although the n-type carrier accumulation layer 2 is formed partly in the wiring region 302 in FIG. 17, the n-type carrier accumulation layer 2 may be formed entirely in the wiring region 302.

G. Sixth Preferred Embodiment

Figure 18:
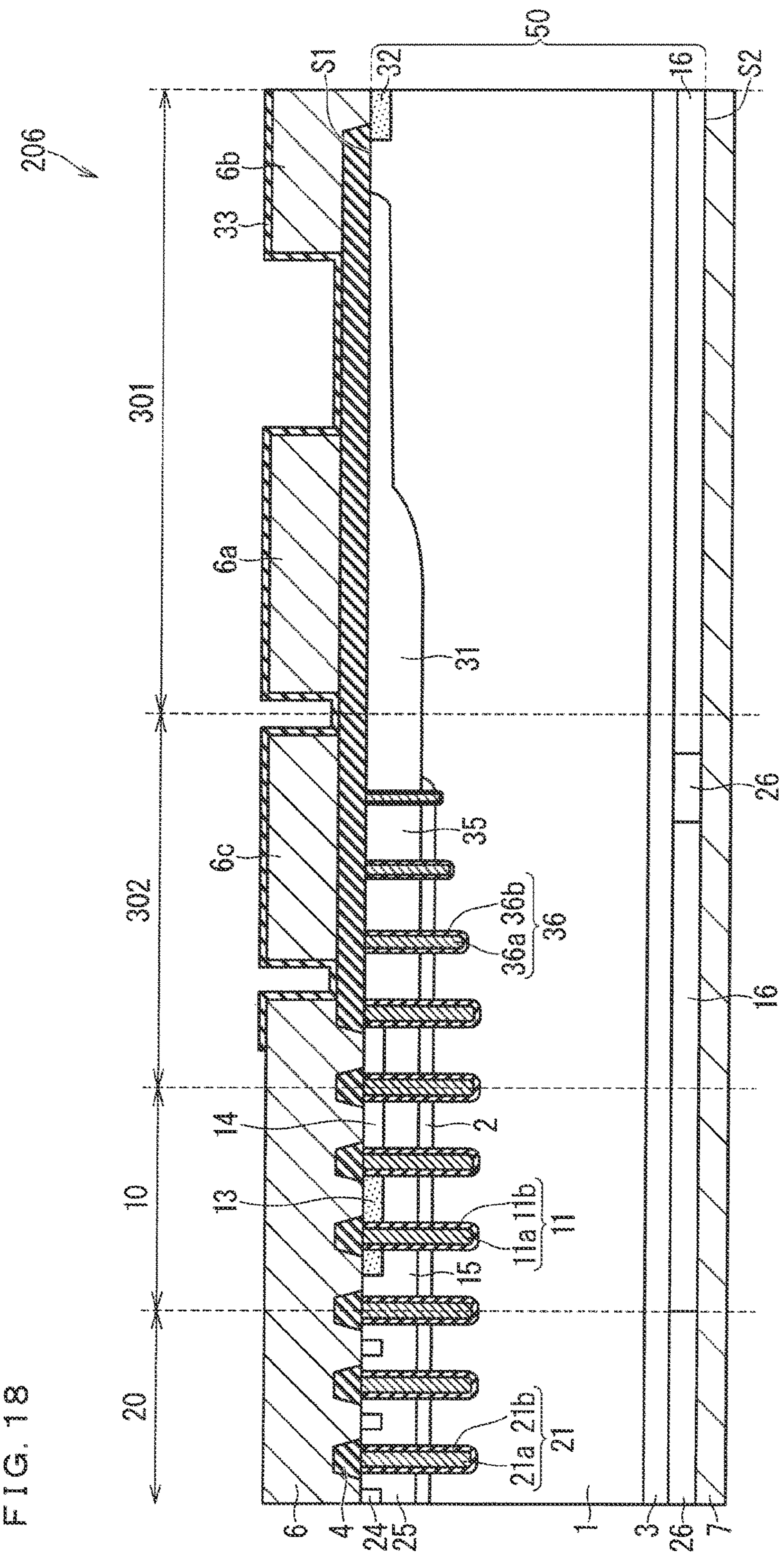
FIG. 18 is a cross-sectional view of the RC-IGBT according to the sixth preferred embodiment taken along the line H-H in FIG. 12.

FIG. 18 is a cross-sectional view of an RC-IGBT 206 that is a semiconductor device according to a sixth preferred embodiment. A top view of the RC-IGBT 206 is the same as illustrated in FIG. 12. FIG. 18 is a cross-sectional view of the RC-IGBT 206 taken along the line H-H in FIG. 12. Hereinafter, differences of the RC-IGBT 206 from the RC-IGBT 205 according to the fifth preferred embodiment will be described.

In the RC-IGBT 206, the n+ type cathode layer 26 is provided on the second main surface S2 side of the n-type drift layer 1 in at least a part of the wiring region 302, that is, between the n-type buffer layer 3 and the collector electrode 7. Since the n+ type cathode layer 26 is provided in the wiring region 302 where a withstand voltage is the lowest, secondary breakdown caused by a vertical pnp structure in the wiring region 302 is suppressed. As a result, it is possible to improve the withstand voltage in the wiring region 302 and suppress breakdown during an avalanche operation.

H. Seventh Preferred Embodiment

Figure 19:
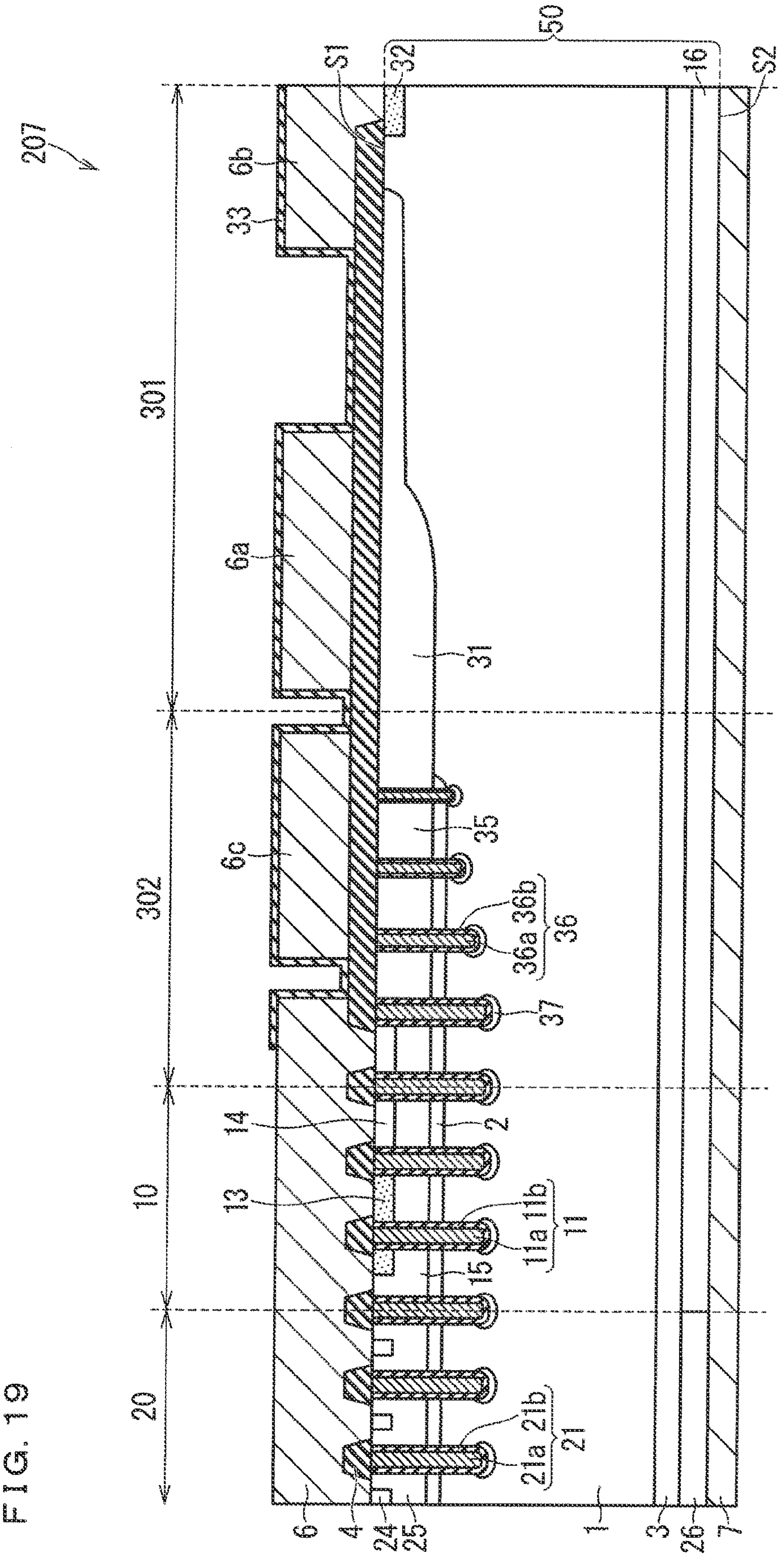
FIG. 19 is a cross-sectional view of the RC-IGBT according to the seventh preferred embodiment taken along the line H-H in FIG. 12.

FIG. 19 is a cross-sectional view of an RC-IGBT 207 that is a semiconductor device according to a seventh preferred embodiment. A top view of the RC-IGBT 207 is the same as illustrated in FIG. 12. FIG. 19 is a cross-sectional view of the RC-IGBT 207 taken along the line H-H in FIG. 12. Hereinafter, differences of the RC-IGBT 207 from the RC-IGBT 205 according to the fifth preferred embodiment will be described.

The RC-IGBT 207 includes a p-type trench bottom layer 37 at each of the bottoms of the active trench gate 11, the dummy trench gate 12, and the wiring trench gate 36. As a result, electric fields at the bottoms of the active trench gate 11, the dummy trench gate 12, and the wiring trench gate 36 are relaxed. As a result, an electric field in the wiring region 302 is relaxed, and a withstand voltage of the RC-IGBT 207 is secured.

I. Eighth Preferred Embodiment

Figure 20:
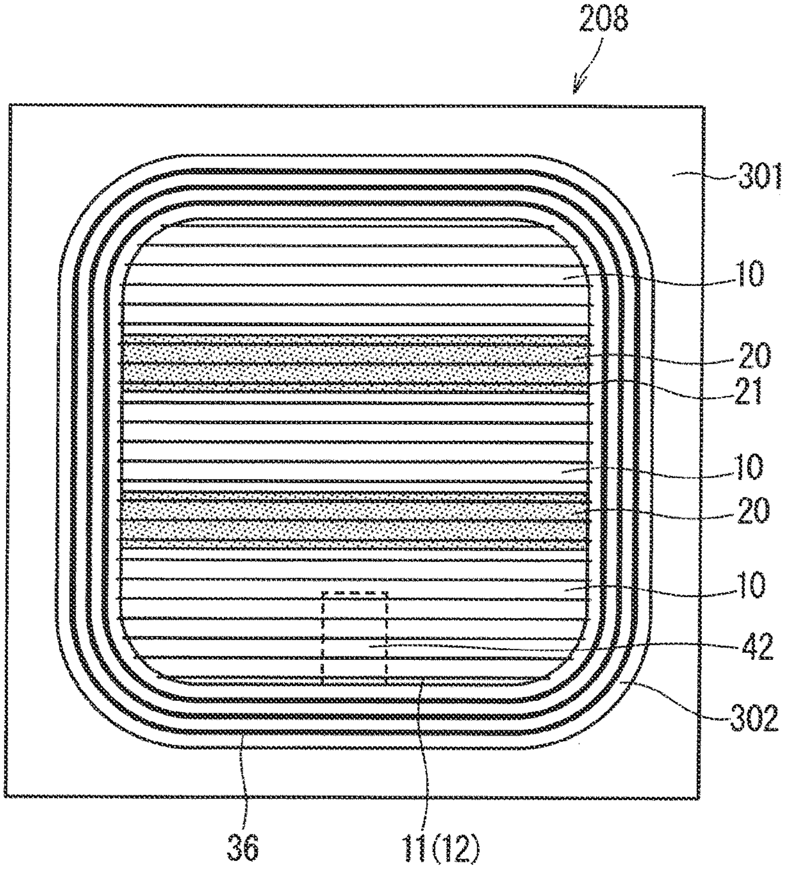
FIG. 20 is a view in which a trench gate is added to the plan view of the RC-IGBT according to the eighth preferred embodiment.

A top view of an RC-IGBT 208 that is a semiconductor device according to an eighth preferred embodiment is the same as illustrated in FIG. 12. FIG. 20 is obtained by adding illustrations of the active trench gate 11 or the dummy trench gate 12 in the IGBT region 10, the diode trench gate 21 in the diode region 20, and the wiring trench gate 36 in the wiring region 302 to FIG. 12.

In the RC-IGBT 208, when viewed from a top surface of a chip, the wiring trench gate 36 is arranged while maintaining a constant distance from the termination region 301. That is, the distance between the wiring trench gate 36 closest to the termination region 301 and the termination region 301 is constant in the entire circumferential direction of the semiconductor substrate 50. When the distance from the termination region 301 to the wiring trench gate 36 is maintained uniform in this manner, a depletion layer stretches uniformly, and a withstand voltage is improved.

In the RC-IGBT 208, the active trench gate 11, the dummy trench gate 12, or the diode trench gate 21 may be provided in the signal pad region 42.

J. Ninth Preferred Embodiment

Figure 21:
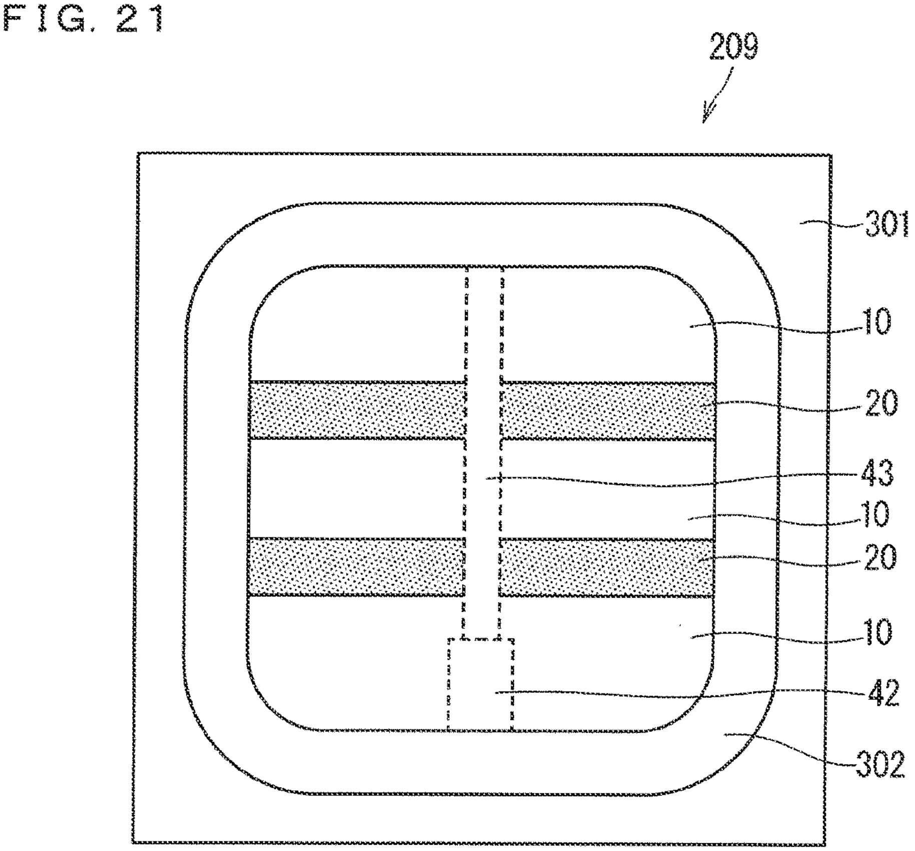
FIG. 21 is a plan view of an RC-IGBT according to a ninth preferred embodiment.
Figure 22:
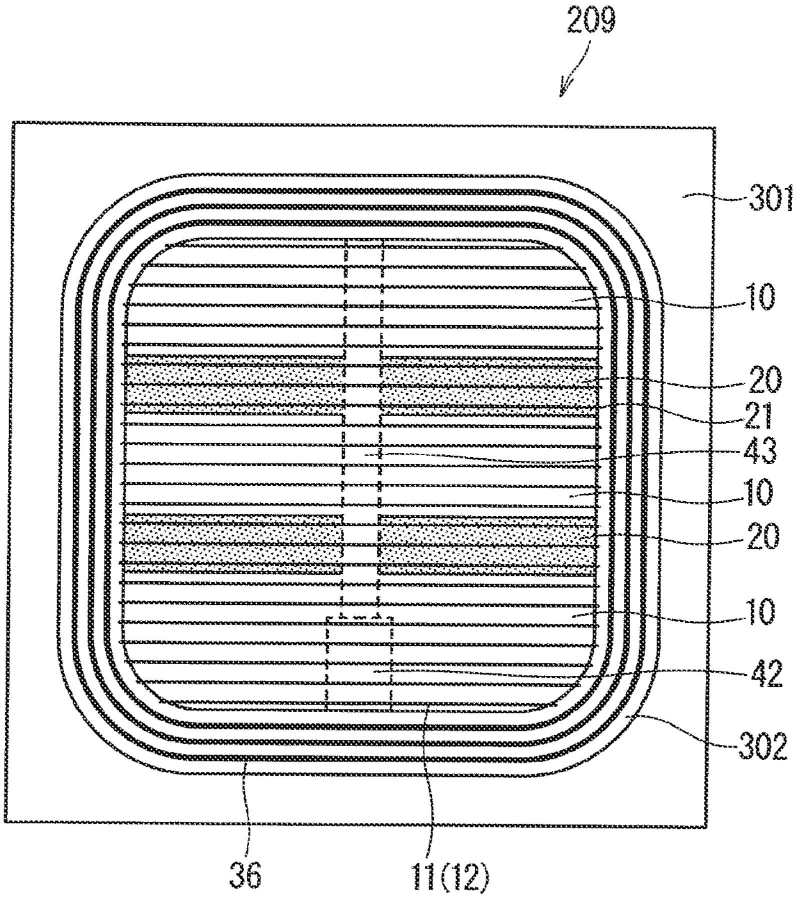
FIG. 22 is a view in which a trench gate is added to the plan view of the RC-IGBT according to the ninth preferred embodiment.

FIG. 21 is a top view of an RC-IGBT 209 that is a semiconductor device according to a ninth preferred embodiment. FIG. 22 is obtained by adding illustrations of the active trench gate 11 or the dummy trench gate 12 in the IGBT region 10, the diode trench gate 21 in the diode region 20, and the wiring trench gate 36 in the wiring region 302 to FIG. 21.

In the RC-IGBT 209, an intra-cell wiring region 43 is provided to straddle the IGBT region 10 and the diode region 20. A configuration of the intra-cell wiring region 43 is similar to the configuration of the wiring region 302. The active trench gate 11 or the dummy trench gate 12 in the IGBT region 10 or the diode trench gate 21 in the diode region 20 may be arranged to extend to the intra-cell wiring region 43. In addition, the wiring trench gate 36 extending in a direction perpendicular to an extending direction of the active trench gate 11, the dummy trench gate 12, or the diode trench gate 21 may be provided in the intra-cell wiring region 43.

K. Tenth Preferred Embodiment

Figure 23:
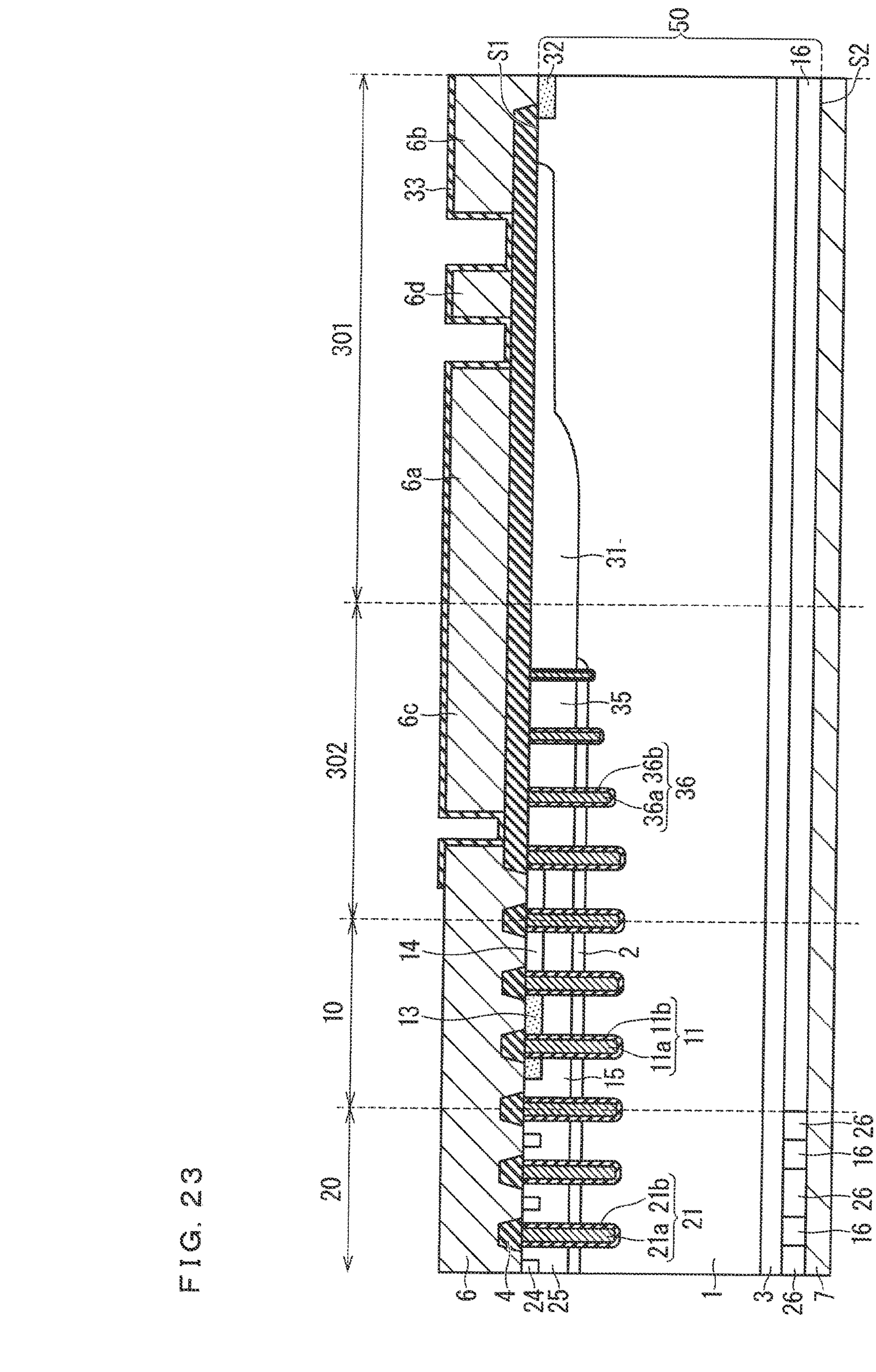
FIG. 23 is a cross-sectional view of the RC-IGBT according to the tenth preferred embodiment taken along the line H-H in FIG. 12.

FIG. 23 is a cross-sectional view of an RC-IGBT 210 that is a semiconductor device according to a tenth preferred embodiment. A top view of the RC-IGBT 210 is the same as illustrated in FIG. 12. FIG. 23 is a cross-sectional view of the RC-IGBT 210 taken along the line H-H in FIG. 12. Hereinafter, differences of the RC-IGBT 210 from the RC-IGBT 205 according to the fifth preferred embodiment will be described.

In the RC-IGBT 210, the p-type collector layer 16 is provided between the n-type buffer layer 3 and the collector electrode 7 in at least a part of the diode region 20.

In the RC-IGBT 210, the wiring electrode 6*c* in the wiring region 302 and the termination electrode 6*a* in the termination region 301 are connected.

In the RC-IGBT 210, a field plate (FP) electrode 6*d* may be provided between the termination electrode 6*a* and the channel stopper electrode 6*b* in the termination region 301. The field plate electrode 6*d* is opposite to the p-type termination well layer 31 across the interlayer insulating film 4. The field plate electrode 6*d* is electrically connected to the termination electrode 6*a* and the channel stopper electrode 6*b* via the semi-insulating film 33. The semi-insulating film 33 may be a semi-insulating single-layer film or laminated film.

Although the preferred embodiments and the like have been described in detail above, the present invention is not limited to the above-described preferred embodiments and the like, and various modifications and substitutions can be made to the above-described preferred embodiments and the like without departing from the scope described in the claims.

Hereinafter, various aspects of the present disclosure will be collectively described as appendices.

Appendix 1

An RC-IGBT comprising a semiconductor substrate that includes a cell region including an IGBT region and a diode region, a termination region surrounding the cell region, and a wiring region provided between the cell region and the termination region, wherein the semiconductor substrate has a first main surface and a second main surface that is a main surface on an opposite side of the first main surface, the semiconductor substrate includes:

a drift layer of a first conductivity type provided in the cell region, the wiring region, and the termination region; and a diffusion layer of a second conductivity type provided on the drift layer on a side close to the first main surface in the IGBT region, the diode region, the wiring region, and the termination region, the diffusion layer includes a base layer in the IGBT region, an anode layer in the diode region, a wiring well layer in the wiring region, and a termination well layer in the termination region, a plurality of trench gates penetrating the diffusion layer from the first main surface to reach the drift layer are formed in the semiconductor substrate, the plurality of trench gates include a plurality of active trench gates in the IGBT region, a plurality of diode trench gates in the diode region, and a plurality of wiring trench gates in the wiring region, and a depth of the base layer is less than depths of the plurality of active trench gates, and is equal to or more than depths of the anode layer, the wiring well layer, and the termination well layer.

Appendix 2

The RC-IGBT according to Appendix 1, wherein a depth of at least one wiring trench gate of the plurality of wiring trench gates is less than the depths of the plurality of active trench gates.

Appendix 3

The RC-IGBT according to Appendix 1 or 2, wherein depths of the plurality of wiring trench gates gradually decrease toward an outer periphery of the semiconductor substrate.

Appendix 4

The RC-IGBT according to any one of Appendices 1 to 3, wherein the plurality of wiring trench gates include a first wiring trench gate and a second wiring trench gate deeper than the first wiring trench gate, and a width of the first wiring trench gate is smaller than a width of the second wiring trench gate.

Appendix 5

The RC-IGBT according to any one of Appendices 1 to 4, wherein at least one pitch of the plurality of wiring trench gates is narrower than pitches of the plurality of active trench gates.

Appendix 6

The RC-IGBT according to any one of Appendices 1 to 5, wherein pitches of the plurality of wiring trench gates decrease toward an outer periphery of the semiconductor substrate.

Appendix 7

The RC-IGBT according to any one of Appendices 1 to 6, wherein the semiconductor substrate further includes a carrier accumulation layer provided on the drift layer on the side close to the first main surface only in the IGBT region.

Appendix 8

The RC-IGBT according to any one of Appendices 1 to 6, wherein the semiconductor substrate further includes a carrier accumulation layer provided on the drift layer on the side close to the first main surface within 1 μm from each of the plurality of trench gates in the IGBT region, the diode region, and the wiring region.

Appendix 9

The RC-IGBT according to any one of Appendices 1 to 8, wherein an integrated concentration, which is an integrated value per unit area in a plan view, of an impurity concentration of the anode layer is lower than the integrated concentration of the base layer.

Appendix 10

The RC-IGBT according to any one of Appendices 1 to 9, wherein the semiconductor substrate includes:

a collector layer of the second conductivity type provided on the drift layer on a side close to the second main surface in the IGBT region; and a cathode layer of the first conductivity type provided on the drift layer on the side close to the second main surface in the diode region and at least a part of the wiring region.

Appendix 11

The RC-IGBT according to any one of Appendices 1 to 10, wherein the semiconductor substrate includes a trench bottom layer of the second conductivity type at each of bottoms of the plurality of trench gates.

Appendix 12

The RC-IGBT according to any one of Appendices 1 to 11, wherein a distance between the termination region and a wiring trench gate closest to the termination region among the plurality of wiring trench gates is constant in an entire circumferential direction of the semiconductor substrate.

Appendix 13

An RC-IGBT comprising a semiconductor substrate that includes a cell region including an IGBT region and a diode region, a termination region surrounding the cell region, and a wiring region provided between the cell region and the termination region, wherein the semiconductor substrate has a first main surface and a second main surface that is a main surface on an opposite side of the first main surface, the semiconductor substrate includes:

a drift layer of a first conductivity type provided in the cell region, the wiring region, and the termination region;

a diffusion layer of a second conductivity type provided on the drift layer on a side close to the first main surface in the IGBT region, the diode region, the wiring region, and the termination region;

a carrier accumulation layer on the side close to the first main surface of the drift layer in the IGBT region, the diffusion layer includes a base layer in the IGBT region, an anode layer in the diode region, a wiring well layer in the wiring region, and a termination well layer in the termination region, a plurality of trench gates penetrating the diffusion layer from the first main surface to reach the drift layer are formed in the semiconductor substrate, the plurality of trench gates include a plurality of active trench gates in the IGBT region, a plurality of diode trench gates in the diode region, and a plurality of wiring trench gates in the wiring region, and a depth of the wiring well layer is less than depths of the plurality of active trench gates, and is equal to or more than a depth of the base layer.

Appendix 14

The RC-IGBT according to Appendix 13, wherein the carrier accumulation layer is provided on the side close to the first main surface of the drift layer in the wiring region.

Appendix 15

The RC-IGBT according to Appendix 13 or 14, wherein a depth of at least one wiring trench gate of the plurality of wiring trench gates is less than the depths of the plurality of active trench gates.

Appendix 16

The RC-IGBT according to any one of Appendices 13 to 15, wherein depths of the plurality of wiring trench gates gradually decrease toward an outer periphery of the semiconductor substrate.

Appendix 17

The RC-IGBT according to any one of Appendices 13 to 16, wherein the plurality of wiring trench gates include a first wiring trench gate and a second wiring trench gate deeper than the first wiring trench gate, and a width of the first wiring trench gate is smaller than a width of the second wiring trench gate.

Appendix 18

The RC-IGBT according to any one of Appendices 13 to 17, wherein at least one pitch of the plurality of wiring trench gates is narrower than pitches of the plurality of active trench gates.

Appendix 19

The RC-IGBT according to any one of Appendices 13 to 18, wherein pitches of the plurality of wiring trench gates decrease toward an outer periphery of the semiconductor substrate.

Appendix 20

The RC-IGBT according to any one of Appendices 13 to 19, wherein an integrated concentration, which is an integrated value per unit area in a plan view, of an impurity concentration of the anode layer is lower than the integrated concentration of the base layer.

Appendix 21

The RC-IGBT according to any one of Appendices 13 to 20, wherein the semiconductor substrate includes:

a collector layer of the second conductivity type provided on the drift layer on a side close to the second main surface in the IGBT region; and a cathode layer of the first conductivity type provided on the drift layer on the side close to the second main surface in the diode region and at least a part of the wiring region.

Appendix 22

The RC-IGBT according to any one of Appendices 13 to 21, wherein the semiconductor substrate includes a trench bottom layer of the second conductivity type at each of bottoms of the plurality of trench gates.

Appendix 23

The RC-IGBT according to any one of Appendices 13 to 22, wherein a distance between the termination region and a wiring trench gate closest to the termination region among the plurality of wiring trench gates is constant in an entire circumferential direction of the semiconductor substrate.

Appendix 24

An RC-IGBT comprising a semiconductor substrate that includes a cell region including an IGBT region and a diode region, a termination region surrounding the cell region, and a wiring region provided between the cell region and the termination region, wherein the semiconductor substrate has a first main surface and a second main surface that is a main surface on an opposite side of the first main surface, the semiconductor substrate includes:

a drift layer of a first conductivity type provided in the cell region, the wiring region, and the termination region;

a diffusion layer of a second conductivity type provided on the drift layer on a side close to the first main surface in the IGBT region, the diode region, the wiring region, and the termination region; and a carrier accumulation layer on the side close to the first main surface of the drift layer in the IGBT region and the wiring region, the diffusion layer includes a base layer in the IGBT region, an anode layer in the diode region, a wiring well layer in the wiring region, and a termination well layer in the termination region, a plurality of trench gates penetrating the diffusion layer from the first main surface to reach the drift layer are formed in the semiconductor substrate, the plurality of trench gates include a plurality of active trench gates in the IGBT region, a plurality of diode trench gates in the diode region, and a plurality of wiring trench gates in the wiring region, and a depth of a deepest portion of the termination well layer is less than depths of the plurality of active trench gates, and more than or equal to depths of the base layer and the wiring well layer.

Appendix 25

The RC-IGBT according to Appendix 24, wherein a depth of at least one wiring trench gate of the plurality of wiring trench gates is less than the depths of the plurality of active trench gates.

Appendix 26

The RC-IGBT according to Appendix 24 or 25, wherein depths of the plurality of wiring trench gates gradually decrease toward an outer periphery of the semiconductor substrate.

Appendix 27

The RC-IGBT according to any one of Appendices 24 to 26, wherein the plurality of wiring trench gates include a first wiring trench gate and a second wiring trench gate deeper than the first wiring trench gate, and a width of the first wiring trench gate is smaller than a width of the second wiring trench gate.

Appendix 28

The RC-IGBT according to any one of Appendices 24 to 27, wherein at least one pitch of the plurality of wiring trench gates is narrower than pitches of the plurality of active trench gates.

Appendix 29

The RC-IGBT according to any one of Appendices 24 to 28, wherein pitches of the plurality of wiring trench gates decrease toward an outer periphery of the semiconductor substrate.

Appendix 30

The RC-IGBT according to any one of Appendices 24 to 29, wherein an integrated concentration, which is an integrated value per unit area in a plan view, of an impurity concentration of the anode layer is lower than the integrated concentration of the base layer.

Appendix 31

The RC-IGBT according to any one of Appendices 24 to 30, wherein the semiconductor substrate includes:

a collector layer of the second conductivity type provided on the drift layer on a side close to the second main surface in the IGBT region; and a cathode layer of the first conductivity type provided on the drift layer on the side close to the second main surface in the diode region and at least a part of the wiring region.

Appendix 32

The RC-IGBT according to any one of Appendices 24 to 31, wherein the semiconductor substrate includes a trench bottom layer of the second conductivity type at each of bottoms of the plurality of trench gates.

Appendix 33

The RC-IGBT according to any one of Appendices 24 to 32, wherein a distance between the termination region and a wiring trench gate closest to the termination region among the plurality of wiring trench gates is constant in an entire circumferential direction of the semiconductor substrate.

While the disclosure has been shown and described in detail, the foregoing description is in all aspects illustrative and not restrictive. It is therefore understood that numerous modifications and variations can be devised.

What is claimed is:

1. An RC-IGBT comprising a semiconductor substrate that includes a cell region including an IGBT region and a diode region, a termination region surrounding the cell region, and a wiring region provided between the cell region and the termination region, wherein the semiconductor substrate has a first main surface and a second main surface that is a main surface on an opposite side of the first main surface, the semiconductor substrate includes:

a drift layer of a first conductivity type provided in the cell region, the wiring region, and the termination region; and a diffusion layer of a second conductivity type provided on the drift layer on a side close to the first main surface in the IGBT region, the diode region, the wiring region, and the termination region, the diffusion layer includes a base layer in the IGBT region, an anode layer in the diode region, a wiring well layer in the wiring region, and a termination well layer in the termination region, a plurality of trench gates penetrating the diffusion layer from the first main surface to reach the drift layer are formed in the semiconductor substrate, the plurality of trench gates include a plurality of active trench gates in the IGBT region, a plurality of diode trench gates in the diode region, and a plurality of wiring trench gates in the wiring region, and a depth of the base layer is less than depths of the plurality of active trench gates, and is equal to or more than depths of the anode layer, the wiring well layer, and the termination well layer.

2. The RC-IGBT according to claim 1, wherein a depth of at least one wiring trench gate of the plurality of wiring trench gates is less than the depths of the plurality of active trench gates.

3. The RC-IGBT according to claim 1, wherein depths of the plurality of wiring trench gates gradually decrease toward an outer periphery of the semiconductor substrate.

4. The RC-IGBT according to claim 1, wherein the plurality of wiring trench gates include a first wiring trench gate and a second wiring trench gate deeper than the first wiring trench gate, and a width of the first wiring trench gate is smaller than a width of the second wiring trench gate.

5. The RC-IGBT according to claim 1, wherein at least one pitch of the plurality of wiring trench gates is narrower than pitches of the plurality of active trench gates.

6. The RC-IGBT according to claim 1, wherein pitches of the plurality of wiring trench gates decrease toward an outer periphery of the semiconductor substrate.

7. The RC-IGBT according to claim 1, wherein the semiconductor substrate further includes a carrier accumulation layer provided on the drift layer on the side close to the first main surface only in the IGBT region.

8. The RC-IGBT according to claim 1, wherein the semiconductor substrate further includes a carrier accumulation layer provided on the drift layer on the side close to the first main surface within 1 μm from each of the plurality of trench gates in the IGBT region, the diode region, and the wiring region.

9. The RC-IGBT according to claim 1, wherein an integrated concentration, which is an integrated value per unit area in a plan view, of an impurity concentration of the anode layer is lower than the integrated concentration of the base layer.

10. The RC-IGBT according to claim 1, wherein the semiconductor substrate includes:

a collector layer of the second conductivity type provided on the drift layer on a side close to the second main surface in the IGBT region; and a cathode layer of the first conductivity type provided on the drift layer on the side close to the second main surface in the diode region and at least a part of the wiring region.

11. The RC-IGBT according to claim 1, wherein the semiconductor substrate includes a trench bottom layer of the second conductivity type at each of bottoms of the plurality of trench gates.

12. The RC-IGBT according to claim 1, wherein a distance between the termination region and a wiring trench gate closest to the termination region among the plurality of wiring trench gates is constant in an entire circumferential direction of the semiconductor substrate.

* * * * *